United States Patent
Sengoku et al.

(10) Patent No.: US 7,851,891 B2
(45) Date of Patent: Dec. 14, 2010

(54) SEMICONDUCTOR DEVICE AND METHOD FOR FABRICATING THE SAME

(75) Inventors: Naohisa Sengoku, Kanagawa (JP); Michikazu Matsumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/424,894

(22) Filed: Apr. 16, 2009

(65) Prior Publication Data

US 2009/0206454 A1    Aug. 20, 2009

Related U.S. Application Data

(62) Division of application No. 10/752,684, filed on Jan. 8, 2004, now abandoned.

(30) Foreign Application Priority Data

Jan. 14, 2003    (JP) ............... 2003-005668

(51) Int. Cl.
    *H01L 29/06* (2006.01)
(52) U.S. Cl. ............... 257/635; 257/638; 257/E29.002; 438/778; 438/783
(58) Field of Classification Search ............. 257/635, 257/E29.02, 638, 645, 651, E29.002; 438/400, 438/404, 758, 778, 783
    See application file for complete search history.

(56) References Cited

U.S. PATENT DOCUMENTS

| 4,893,158 | A | | 1/1990 | Mihara et al. |
| 4,912,061 | A | | 3/1990 | Nasr |
| 5,416,352 | A | * | 5/1995 | Takada .............. 257/413 |
| 5,633,523 | A | * | 5/1997 | Kato ................. 257/369 |
| 5,641,980 | A | | 6/1997 | Yamaguchi et al. |

(Continued)

FOREIGN PATENT DOCUMENTS

JP    57-062564    4/1982

(Continued)

OTHER PUBLICATIONS

R.L. Smith et al., "Porous Silicon Formation Mechanisms", American Institute of Physics, J. Appl. Phys. 71, pp. R1-R22, Apr. 15, 1992.

(Continued)

*Primary Examiner*—Matthew S Smith
*Assistant Examiner*—Michele Fan
(74) *Attorney, Agent, or Firm*—McDermott Will & Emery LLP

(57) ABSTRACT

A method for fabricating a semiconductor device includes the steps of: forming a first insulating film on a semiconductor substrate; removing part of the first insulating film; forming a second insulating film having a leakage current density higher than that of the first insulating film on a region where the part of the first insulating film has been removed on the semiconductor substrate; forming an undoped semiconductor film on the first and second insulating films; implanting an impurity into part of the undoped semiconductor film, thereby defining semiconductor regions of a first conductivity type dotted as discrete islands; forming a third insulating film on the semiconductor regions of the first conductivity type and the undoped semiconductor film; and removing part of the third insulating film by wet etching. At least the second insulating film is formed under the semiconductor regions of the first conductivity type.

22 Claims, 16 Drawing Sheets

U.S. PATENT DOCUMENTS

| | | | |
|---|---|---|---|
| 5,710,461 | A | 1/1998 | Nguyen et al. |
| 5,753,525 | A | 5/1998 | Hsu et al. |
| 5,807,770 | A | 9/1998 | Mineji |
| 5,854,502 | A | 12/1998 | Nishihara |
| 5,904,490 | A * | 5/1999 | Tabara .................. 438/18 |
| 5,925,904 | A | 7/1999 | Schmidt et al. |
| 5,986,284 | A | 11/1999 | Kusaba et al. |
| 6,008,095 | A * | 12/1999 | Gardner et al. ............ 438/296 |
| 6,172,733 | B1 | 1/2001 | Hong et al. |
| 6,188,136 | B1 | 2/2001 | Asamura |
| 6,225,667 | B1 | 5/2001 | Buynoski et al. |
| 6,278,154 | B1 | 8/2001 | Abe |
| 6,335,285 | B1 | 1/2002 | Chun et al. |
| 6,376,309 | B2 | 4/2002 | Wang et al. |
| 6,903,420 | B2 | 6/2005 | Wang |
| 2002/0155661 | A1* | 10/2002 | Massingill et al. .......... 438/244 |
| 2002/0179978 | A1 | 12/2002 | Sato |
| 2003/0134486 | A1 | 7/2003 | Wang |
| 2003/0151449 | A1* | 8/2003 | Nakagawa et al. ......... 327/536 |
| 2003/0201494 | A1 | 10/2003 | Maeda et al. |

FOREIGN PATENT DOCUMENTS

| | | |
|---|---|---|
| JP | 59-125654 | 7/1984 |
| JP | 02-307261 | 12/1990 |
| JP | 03-206657 | 9/1991 |
| JP | 05-067777 | 3/1993 |
| JP | 9-82896 | 3/1997 |
| JP | 10-74846 | 3/1998 |
| JP | 10-144904 | 5/1998 |
| JP | 2001-230425 A | 8/2001 |

OTHER PUBLICATIONS

S. Wolf, "Silicon Processing for the VLSI Era, vol. 3—The Submicron MOSFET", Lattice Press, Sunset Beach, CA (ISBN: 0-961672-3) (1995), pp. 134-137.

"Modern Semiconductor Device Physics", Ed. by S.M. Sze, John Wiley & Sons, New York (ISBN: 0-471-15237-4) (1998), Appendix J on p. 545.

O. Madelung, Semiconductors-Basic Data, 2nd revised Edition, Springer Verlag, Berlin—Heidelberg—New York (ISBN: 3-540-60883-4) (1996); p. 18.

Computerized Translation of "Semiconductor Device and Manufacturing Method" Patent JP—09082896 A (IDS item), (Date: Mar. 28, 1997).

Merriam-Webster's Collegiate Dictionary, tenth Edition, p. 847 (Merriam-Webster, Inc., Springfield, MA (USA) (1999).

English Translation of Japanese Notice of Reasons for Rejection issued in Japanese Patent Application No. JP 2003-005668, mailed Aug. 25, 2009.

Japanese Office Action, with English Translation, issued in Japanese Patent Application No. JP 2003-005668, dated Dec. 16, 2009.

* cited by examiner

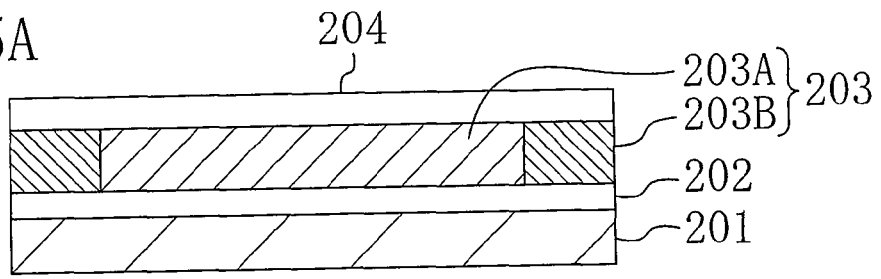
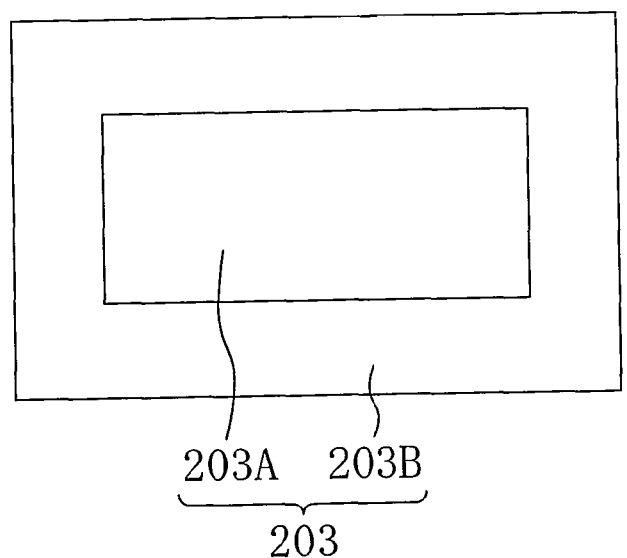
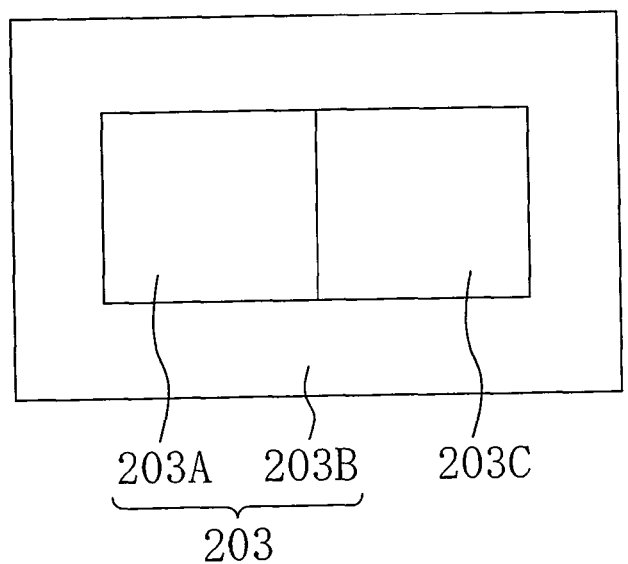

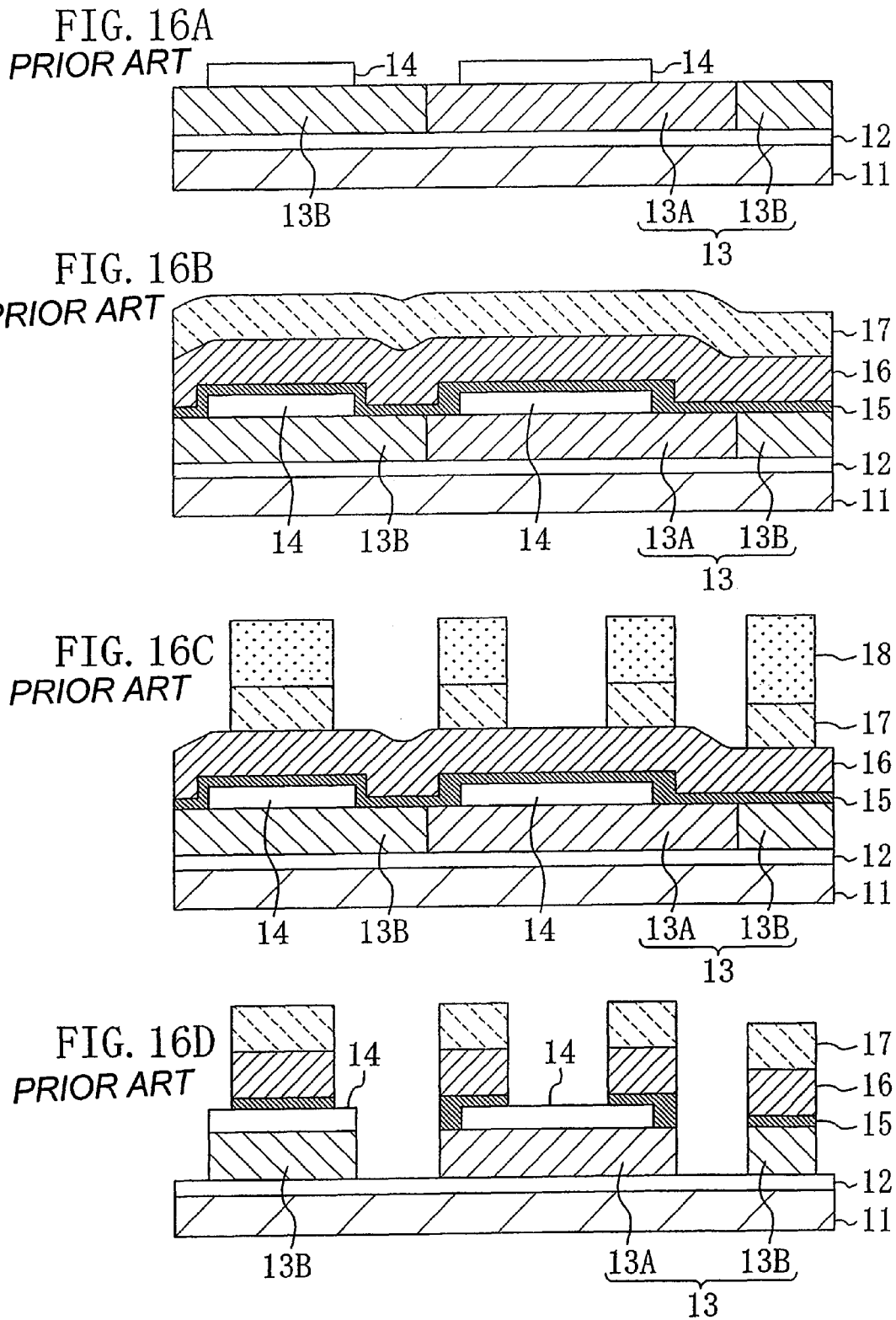

SEMICONDUCTOR DEVICE AND METHOD FOR FABRICATING THE SAME

RELATED APPLICATIONS

This application is a divisional of U.S. application Ser. No. 10/752,684, filed Jan. 8, 2004 now abandoned, claiming priority of Japanese Application No. 2003-005668, filed Jan. 14, 2003, the entire contents of each of which are hereby incorporated by reference.

BACKGROUND OF THE INVENTION

A conventional semiconductor device and a conventional method for fabricating the device will be described with reference to FIGS. 16A through 16D.

FIGS. 16A through 16D are cross-sectional views showing respective process steps of a method for fabricating the conventional semiconductor device.

First, as shown in FIG. 16A, a silicon oxide film 12 is formed on a silicon substrate 11, a polysilicon film 13 is deposited over the silicon oxide film 12, and then dopants such as boron and phosphorus are implanted, thereby defining a p-type semiconductor region 13A and an n-type semiconductor region 13B in the polysilicon film 13. Subsequently, a silicon oxide film 14 is deposited over the polysilicon film 13, and then patterning is performed such that part of the silicon oxide film 14 remains only on a portion where a polysilicon resistor or a capacitor is to be formed. Thereafter, as shown in FIG. 16B, a TiN film 15 and a W film 16 are deposited in this order as a metal film, and then a SiN film 17 is deposited under a reduced pressure. Then, as shown in FIG. 16C, patterning is performed such that a resist 18 remains on portions to be both edges of a polysilicon resistor, a portion to be a gate electrode and a port on to be a capacitor. Thereafter, the SiN film 17 is patterned by dry etching to serve as a hard mask.

Next, as shown in FIG. 16D, the resist 18 is removed, and then dry etching is performed, so that a gate electrode with a normal polymetal gate structure is formed on a portion where the SiN film 17 remains and the silicon oxide film 14 does not remain after the patterning (see right-hand end of FIG. 16D), a polysilicon resistor in which the polysilicon film 13 is located under the silicon oxide film 14 with the silicon oxide film 14 serving as a hard mask is formed on a portion where the SiN film 17 does not remain and the silicon oxide film 14 remains after the patterning (see the middle of FIG. 16D), and a capacitor is formed together with the gate electrode and the polysilicon resistor (see the light-hand end of FIG. 16D). The polysilicon resistor has polymetal gate structures at both ends thereof, and wiring is connected to these ends in a subsequent process step (not shown). With respect to the capacitor, the silicon oxide film 14 is used as a capacitive insulating film by connecting wiring to the metal film.

In this manner, the polysilicon resistor, the capacitor and the gate electrode are formed (up to this process, see Japanese Laid-Open Publication No. 09-82896, for example).

However, we further studied the process for fabricating the polysilicon resistor, the capacitor and the gate electrode to find out the following problems.

FIGS. 17A through 17C are views for explaining problems arising in the process for fabricating the conventional polysilicon resistor, capacitor and gate electrode. FIGS. 17A and 17B are cross-sectional views and FIG. 17C shows an SEM image and an FIB image.

First, as shown in FIG. 17A, a silicon oxide film 22 is formed on a silicon substrate 21, a polysilicon film 23 is deposited over the silicon oxide film 22, and boron ions are implanted using a resist pattern as a mask, thereby defining a p-type semiconductor region 23A in the shape of an island in the polysilicon film 23. Subsequently, a silicon oxide film 24 is deposited on the polysilicon film 23 and is subjected to heat treatment at 750° C. At this time, the p-type semiconductor region 23A is vertically sandwiched between the underlying silicon oxide film 22 and the overlying silicon oxide film 24 and is horizontally surrounded with an undoped semiconductor region 23B. That is to say, considering that an undoped silicon film constituting the undoped semiconductor region 23B is substantially considered as an insulating film, the p-type semiconductor region 23A is completely surrounded with insulating films on all sides vertically and horizontally.

In this case, we found that when a resist 25 is patterned and then the silicon oxide film 24 on the p-type semiconductor region 23A is etched using the resist pattern as a mask, polysilicon in the p-type semiconductor region 23A disappears to form a hole 26, as shown in FIG. 17B. This disappearance of polysilicon is noticeable in a case where an undoped silicon oxide film formed under sub atmospheric conditions is used as the silicon oxide film 24.

As shown in FIG. 17C, according to observation results from the SEM image and the FIB image which show the hole 26 formed due to the disappearance of polysilicon, polysilicon disappears over a distance of several microns, and this disappearance of polysilicon is observed in the p-type semiconductor region 23A or at the boundary between the p-type semiconductor region 23A and the no-doped semiconductor region 23B. The disappearance of polysilicon is observed at a surface density of about 20 ($cm^{-2}$). The disappearance of polysilicon causes the fault that the gate opens and a short-circuit fault at the gate due to entering of metal into a portion where polysilicon has disappeared. The disappearance of polysilicon also reduces the thickness of the gate oxide film to make the insulating property deteriorate so that reliability is reduced as well as a short-circuit fault between the gate electrode and the silicon substrate 21 occurs.

SUMMARY OF THE INVENTION

It is therefore an object of the present invention to provide a semiconductor device in which the disappearance of polysilicon is prevented and a method for fabricating the semiconductor device.

In order to achieve this object, we examined conditions under which the disappearance of polysilicon occurs.

We prepared a sample by the following manner. First, a polysilicon film was deposited over a silicon substrate with an oxide film with a thickness of 7 nm interposed therebetween, and then boron ions were implanted using a resist pattern as a mask, thereby defining an island p-type polysilicon region. Subsequently, a silicon oxide film was deposited and then the resultant sample was subjected to heat treatment at 750° C. and then to a process using a buffered hydrofluoric acid. At this time, a part of polysilicon had disappeared over the entire surface of the sample at a surface density of about 20 ($cm^{-2}$). However, we found that, when the thickness of the oxide film under the polysilicon film was 2.6 nm, polysilicon did not disappear at all.

From the foregoing finding, it turned out that polysilicon does not disappear if the oxide film under the polysilicon film is very thin.

In view of this, we concluded that confinement of charge within the p-type polysilicon region is a cause of the disappearance of polysilicon. Specifically, our conclusion is as follows: when a wafer is charged with the p-type polysilicon region surrounded with thick insulating films and an undoped silicon film on all sides vertically and horizontally, charge is confined within the p-type polysilicon region and will not be emitted from the region in subsequent process steps, so that the confined charge becomes a cause of the disappearance of polysilicon. However, in a case where the oxide film is so thin as to allow tunneling of charge, even if charge is confined within the p-type polysilicon region, the charge is emitted toward the silicon substrate through the thin oxide film, resulting in that the p-type polysilicon region is not charged any more and polysilicon does not disappear. It is considered that the silicon substrate is charged by friction or the like in various processes such as plasma processing or in transferring the silicon substrate.

The reason why charge is a cause of the disappearance of polysilicon is not clear but it can be concluded that the disappearance of polysilicon is caused by the same mechanism as that of silicon anodization, i.e., formation of porous silicon or electro polishing.

Anodization is a phenomenon in which silicon is etched when a silicon substrate and an electrode of a noble metal such as Pt are disposed at the anode and cathode, respectively, and then are energized in a hydrofluoric acid. The mechanism thereof is considered to be that strong covalent bonds between silicon atoms are weakened by the presence of charge and thereby silicon is etched with the hydrofluoric acid (ref. R. L. Smith and S. D. Collins, J. Appl. Phys. 71 (1992) R1).

The disappearance of polysilicon described above is considered to be caused by a mechanism similar to that of the above phenomenon. Specifically, if the p-type polysilicon region is surrounded with insulating films and an undoped silicon film, charge generated through processing is not emitted from the p-type polysilicon region but confined within this region. If etching is performed using a buffered hydrofluoric acid in this state, the insulating film on top of the polysilicon film is etched first, but at the moment at which any portion of the p-type polysilicon region is exposed, the charge is emitted toward the buffered hydrofluoric acid and polysilicon is etched simultaneously with this emission. It is considered that the disappearance of polysilicon occurs as a result of the above process.

In addition, it is also considered that the disappearance of polysilicon described above also occurs in a case where there is no net electrification in the p-type polysilicon region. This is considered to be basically because of anodization based on emission of charge from the p-type polysilicon region toward the etchant. That is to say, it is considered that a difference in Fermi-level between the etchant and the p-type polysilicon region causes transfer of charge at the moment of the contact therebetween, so that charge is emitted and polysilicon disappears.

The disappearance of polysilicon in this case occurs not only in a case where the p-type polysilicon region is surrounded with the undoped polysilicon region but also in cases where an n-type polysilicon region is surrounded with an undoped polysilicon region, where a p-type polysilicon region is surrounded with an n-type polysilicon region and where an n-type polysilicon region is surrounded with a p-type polysilicon region.

In view of this, to achieve the above object, an inventive first method for fabricating a semiconductor device includes the steps of: forming a first insulating film on a semiconductor substrate; removing part of the first insulating film; forming a second insulating film having a leakage current density higher than that of the first insulating film on a region where the part of the first insulating film has been removed on the semiconductor substrate; forming an undoped semiconductor film on the first and second insulating films; implanting an impurity into part of the undoped semiconductor film, thereby defining semiconductor regions of a first conductivity type dotted as discrete islands; forming a third insulating film on the semiconductor regions of the first conductivity type and the undoped semiconductor film; and removing part of the third insulating film by wet etching, wherein at least the second insulating film is formed under the semiconductor regions of the first conductivity type.

With the first inventive method, the second insulating film allows charge in the semiconductor regions of the first conductivity type to be emitted to the outside of the first and second insulating films, so that it is possible to prevent the disappearance of polysilicon which occurs when any part of the semiconductor regions of the first conductivity type is exposed during the removal of part of the third insulating film by wet etching.

The first inventive method preferably further includes the step of implanting an impurity into the undoped semiconductor film to define a semiconductor region of a second conductivity type such that the semiconductor region of the second conductivity type is adjacent to the semiconductor regions of the first conductivity type. The step of forming the third insulating film is preferably the step of forming the third insulating film on the semiconductor regions of the first conductivity type, the semiconductor region of the second conductivity type and the undoped semiconductor film. At least the second insulating film is preferably formed under the semiconductor region of the second conductivity type.

Then, the second insulating film also allows charge in the semiconductor region of the second conductivity type to be emitted to the outside of the first and second insulating films, so that it is possible to prevent the disappearance of polysilicon which occurs when any part of the semiconductor region of the second conductivity type is exposed during the removal of part of the third insulating film by wet etching.

In the first inventive method, the average density of leakage current from the semiconductor regions of the first conductivity type to the outside of the first and second insulating films preferably has an absolute value of $1 \times 10^{-10}$ (A/mm$^2$) or more in at least one polarity when the potential difference between the semiconductor regions of the first conductivity type and the outside of the first and second insulating films has an absolute value of 1.5 V.

Then, the disappearance of polysilicon is prevented effectively.

In the first inventive method, the average density of leakage current from the semiconductor region of the second conductivity type to the outside of the first and second insulating films preferably has an absolute value of $1 \times 10^{-10}$ (A/mm$^2$) or more in at least one polarity when the potential difference between the semiconductor region of the second conductivity type and the outside of the first and second insulating films has an absolute value of 1.5 V.

Then, the disappearance of polysilicon is prevented effectively.

In the first inventive method, the wet etching is preferably performed with a chemical solution containing fluorine ions.

A second inventive method for fabricating a semiconductor device includes the steps of: forming a first insulating film on a semiconductor substrate; forming an undoped semiconductor film on the first insulating film; implanting an impurity into part of the undoped semiconductor film, thereby defining semiconductor regions of a first conductivity type dotted as discrete islands; forming, at least on the semiconductor regions of the first conductivity type, a second insulating film having a leakage current density higher than that of the first insulating film; and removing part of the second insulating film by wet etching.

With the second inventive method, the second insulating film allows charge in the semiconductor regions of the first conductivity type to be emitted to the outside of the second insulating film, so that it is possible to prevent the disappearance of polysilicon which occurs when any part of the semiconductor regions of the first conductivity type is exposed during the removal of part of the second insulating film by wet etching.

The second inventive method preferably further includes the step of implanting an impurity into the undoped semiconductor film to define a semiconductor region of a second conductivity type such that the semiconductor region of the second conductivity type is adjacent to the semiconductor regions of the first conductivity type. The step of forming the second insulating film is preferably performed at least on the semiconductor regions of the first conductivity type and the semiconductor region of the second conductivity type.

Then, the second insulating film also allows charge in the semiconductor region of the second conductivity type to be emitted to the outside of the second insulating film, so that it is possible to prevent the disappearance of polysilicon which occurs when any part of the semiconductor region of the second conductivity type is exposed during the removal of part of the second insulating film by wet etching.

In the second inventive method, average leakage current density from the semiconductor regions of the first conductivity type to the outside of the second insulating film preferably has an absolute value of $1 \times 10^{-10}$ (A/mm$^2$) or more in at least one polarity when the potential difference between the semiconductor regions of the first conductivity type and the outside of the second insulating film has an absolute value of 1.5 V.

Then, the disappearance of polysilicon is prevented effectively.

In the second inventive method, the wet etching is preferably performed with a chemical solution containing fluorine ions.

A third inventive method for fabricating a semiconductor device includes the steps of: forming a first insulating film on a semiconductor substrate; removing part of the first insulating film; forming a second insulating film having a leakage current density higher than that of the first insulating film on a region where the part of the first insulating film has been removed on the semiconductor substrate; forming an undoped semiconductor film on the first and second insulating films; implanting at least one impurity into part of the undoped semiconductor film, thereby defining a semiconductor region of at least one conductivity type; removing part of the semiconductor region of at least one conductivity type and the undoped semiconductor film, thereby forming a patterned semiconductor region of at least one conductivity type; forming a third insulating film on the first and second insulating films such that the third insulating film covers the patterned semiconductor region of at least one conductivity type; and removing part of the third insulating film by wet etching, wherein at least the second insulating film is formed under the patterned semiconductor region of at least one conductivity type.

With the third inventive method, the second insulating film allows charge in the patterned semiconductor region of at least one conductivity type to be emitted to the outside of the first and second insulating films, so that it is possible to prevent the disappearance of polysilicon which occurs when any part of the patterned semiconductor region of at least one conductivity type is exposed during the removal of part of the third insulating film by wet etching.

The third inventive method may further include the step of defining the semiconductor region of at least one conductivity type includes the step of defining a semiconductor region of a first conductivity type, and then defining a semiconductor region of a second conductivity type such that the semiconductor region of the second conductivity type is adjacent to the semiconductor region of the first conductivity type.

In the third inventive method, the average density of leakage current from the semiconductor region of at least one conductivity type to the outside of the first and second insulating films preferably has an absolute value of $1 \times 10^{10}$ (A/mm$^2$) or more in at least one polarity when the potential difference between the patterned semiconductor region of at least one conductivity type and the outside of the first and second insulating films has an absolute value of 1.5 V.

Then, the disappearance of polysilicon is prevented effectively.

In the third inventive method, the wet etching is preferably performed with a chemical solution containing fluorine ions.

A fourth inventive method for fabricating a semiconductor device includes the steps of: forming a first insulating film on a semiconductor substrate; forming an undoped semiconductor film on the first insulating film; implanting at least one impurity into the undoped semiconductor film, thereby defining a semiconductor region of at least one conductivity type; removing part of the semiconductor region of at least one conductivity type and the undoped semiconductor film, thereby forming a patterned semiconductor region of at least one conductivity type; forming a second insulating film having a leakage current density higher than that of the first insulating film on the first insulating film such that the second insulating film covers the patterned semiconductor region of at least one conductivity type; and removing part of the second insulating film by wet etching.

With the forth inventive method, the second insulating film allows charge in the patterned semiconductor region of at least one conductivity type to be emitted to the outside of the second insulating film, so that it is possible to prevent the disappearance of polysilicon which occurs when any part of the patterned semiconductor region of at least one conductivity type is exposed during the removal of part of the second insulating film by wet etching.

In the fourth inventive method, the semiconductor region of at least one conductivity type may include a semiconductor region of a first conductivity type and a semiconductor region of a second conductivity type.

In the fourth inventive method, the average density of leakage current from the semiconductor region of at least one conductivity type to the outside of the second insulating film preferably has an absolute value of $1 \times 10^{-10}$ (A/mm$^2$) or more in at least one polarity when the potential difference between the patterned semiconductor region of at least one conductivity type and the outside of the second insulating film has an absolute value of 1.5 V.

Then, the disappearance of polysilicon is prevented effectively.

In the fourth inventive method, the wet etching is preferably performed with a chemical solution containing fluorine ions.

To solve the problems described above, a first inventive semiconductor device includes: a first insulating film formed on a semiconductor substrate; a semiconductor film of a conductivity type formed on the first insulating film; a second insulating film formed on the semiconductor film of the conductivity type such that both ends of the second insulating film are exposed on the semiconductor film of the conductivity type; and a conductive film formed on each of the ends of the second insulating film on the semiconductor film of the conductivity type, wherein the second insulating film has a leakage current density higher than that of the first insulating film.

Since the first inventive semiconductor device includes the second insulating film allowing charge in the semiconductor film of the conductivity type to be emitted to the outside of the second insulating film, it is possible to prevent the disappearance of polysilicon which occurs when part of the second insulating film is removed such that both ends of the semiconductor film of the conductivity type are exposed.

In the first inventive semiconductor device, the second insulating film is preferably a silicon oxide film, a silicon nitride film, an undoped silicon oxide film formed under sub atmospheric conditions, a TEOS film formed under a reduced pressure, or a thermal oxidation film.

In the first inventive semiconductor device, the second insulating film preferably has a thickness smaller than that of the first insulating film.

Then, charge in the semiconductor film of the conductivity type is more effectively emitted to the outside of the second insulating film.

In the first inventive semiconductor device, the second insulating film preferably has a film density lower than that of the first insulating film.

Then, charge in the semiconductor film of the conductivity type is more effectively emitted to the outside of the second insulating film.

In the first inventive semiconductor device, the conductive film is preferably a metal silicide film or a metal film having a high melting point.

In the first inventive semiconductor device, the leakage current density preferably has an absolute value of $1 \times 10^{-10}$ $(A/mm^2)$ or more in at least one polarity when the potential difference between the semiconductor film of the conductivity type and the outside of the second insulating film has an absolute value of 1.5 V.

Then, the disappearance of polysilicon is prevented effectively.

A second inventive semiconductor device includes: first and second insulating films formed to be in contact with each other on a semiconductor substrate; a semiconductor film of a conductivity type formed on the first and second insulating films; a third insulating film formed on the semiconductor film of the conductivity type such that both ends of the third insulating film are exposed on the semiconductor film of the conductivity type; and a conductive film formed on each of the ends of the third insulating film on the semiconductor film of the conductivity type, wherein the second insulating film has a leakage current density higher than that of the first insulating film.

Since the second inventive semiconductor device includes the second insulating film allowing charge in the semiconductor film of the conductivity type to be emitted to the outside of the first and second insulating films, it is possible to prevent the disappearance of polysilicon which occurs when part of the third insulating film is removed such that both ends of the third insulating film are exposed.

In the second inventive semiconductor device, the second insulating film preferably has a thickness smaller than that of the first insulating film.

Then, charge in the semiconductor film of the conductivity type is more effectively emitted to the outside of the first and second insulating films.

In the second inventive semiconductor device, the conductive film is preferably a metal silicide film or a metal film having a high melting point.

In the second inventive semiconductor device, the leakage current density preferably has an absolute value of $1 \times 10^{-10}$ $(A/mm^2)$ or more in at least one polarity when the potential difference between the semiconductor film of the conductivity type and the outside of the first and second insulating films has an absolute value of 1.5 V.

Then, the disappearance of polysilicon is prevented effectively.

BRIEF DESCRIPTION OF THE DRAWINGS

FIG. 5A is a cross-sectional view for describing a semiconductor device and a method for fabricating the device according to a second embodiment of the present invention. FIGS. 5B and 5C are plan views for describing the semiconductor device and the method for fabricating the device of the second embodiment.

FIGS. 16A through 16D are cross-sectional views for describing a conventional semiconductor device and a method for fabricating the device.

DESCRIPTION OF THE PREFERRED EMBODIMENTS

Embodiment 1

Hereinafter, a semiconductor device and a method for fabricating the semiconductor device according to a first embodiment of the present invention will be described with reference to FIGS. 1A, 1B, 2A, 2B, 3 and 4.

Figure 1A:
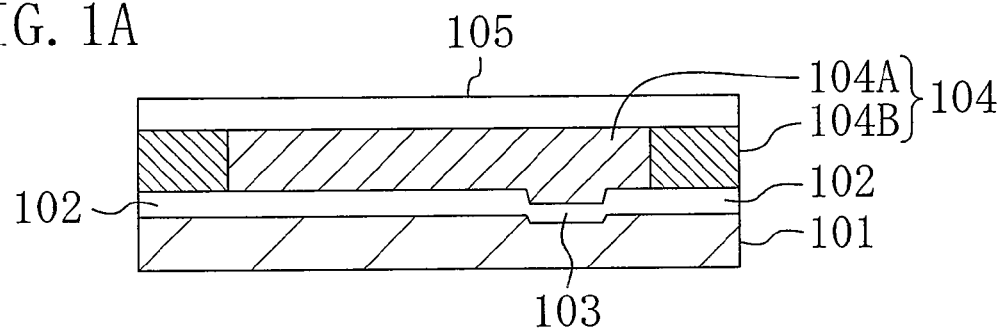
FIG. 1A is a cross-sectional view for describing a semiconductor device and a method for fabricating the device according to a first embodiment of the present invention.
Figure 1B:
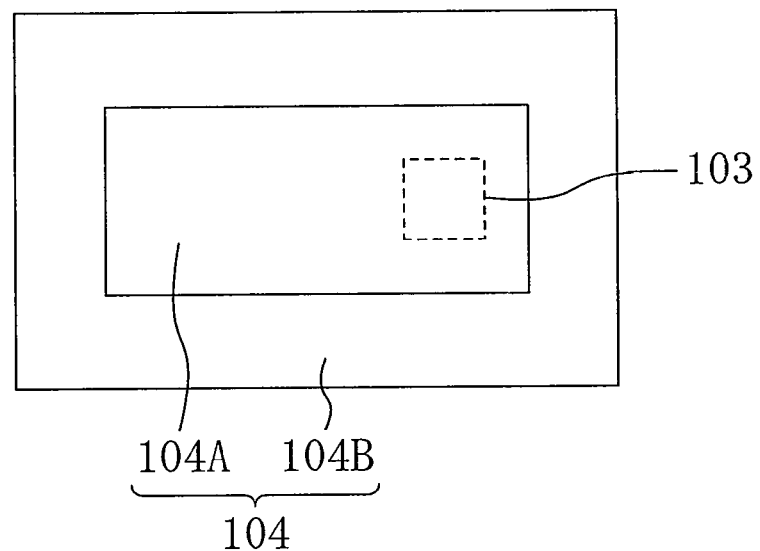
FIG. 1B is a plan view for describing the semiconductor device and the method for fabricating the device of the first embodiment.
Figure 2A:
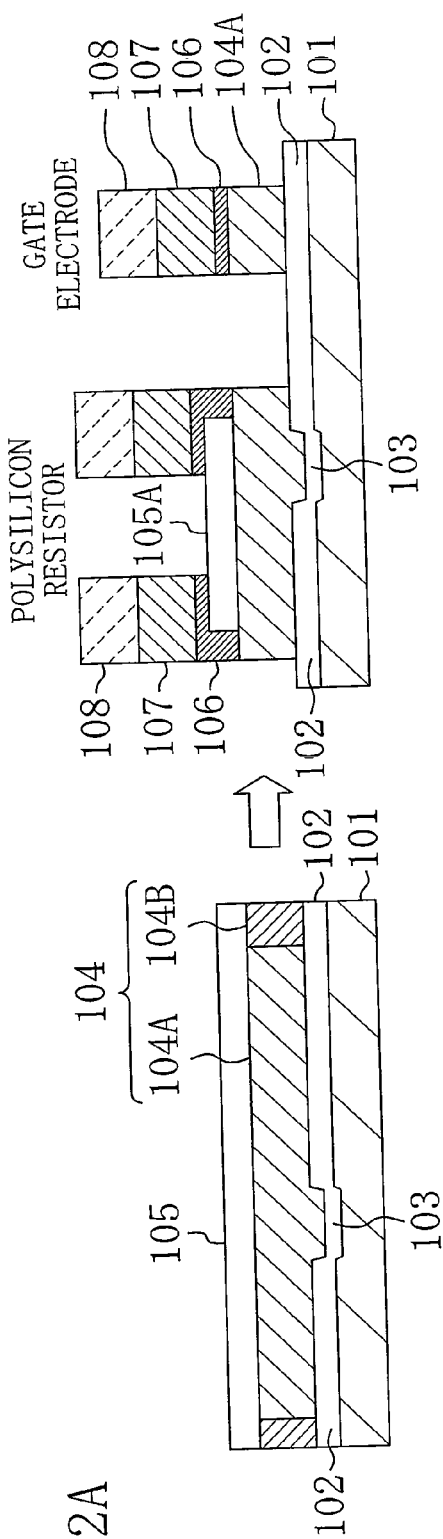
FIGS. 2A and 2B are cross-sectional views for describing the semiconductor device and the method for fabricating the device of the first embodiment.
Figure 2B:
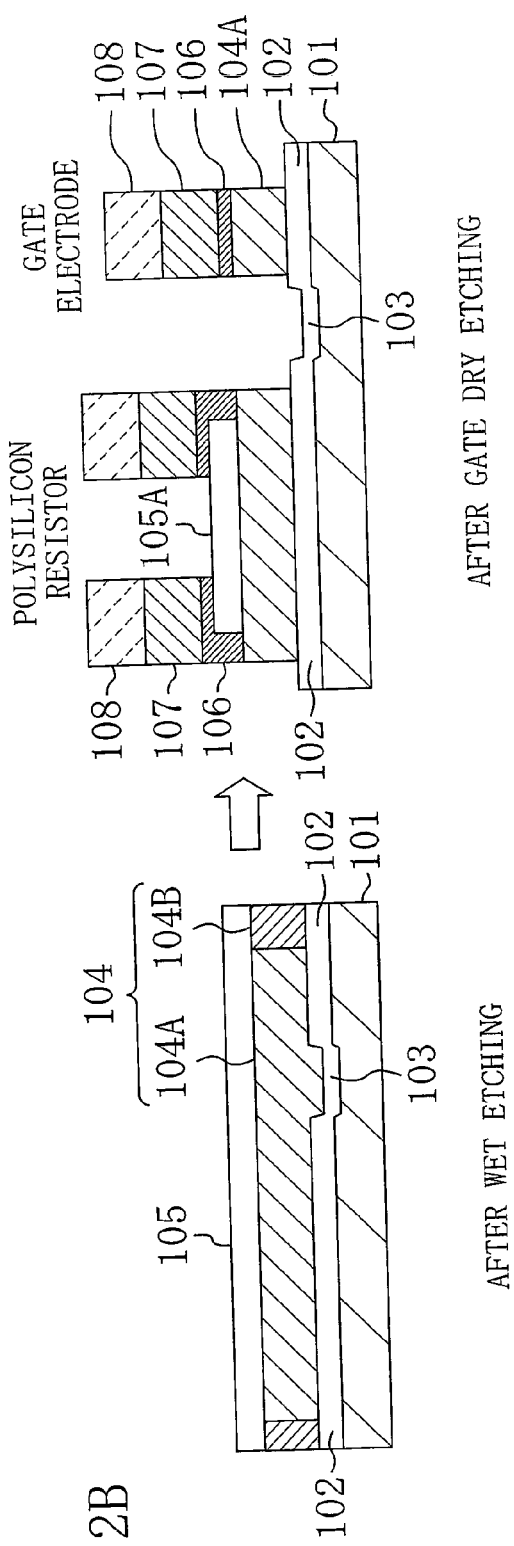
Figure 3:
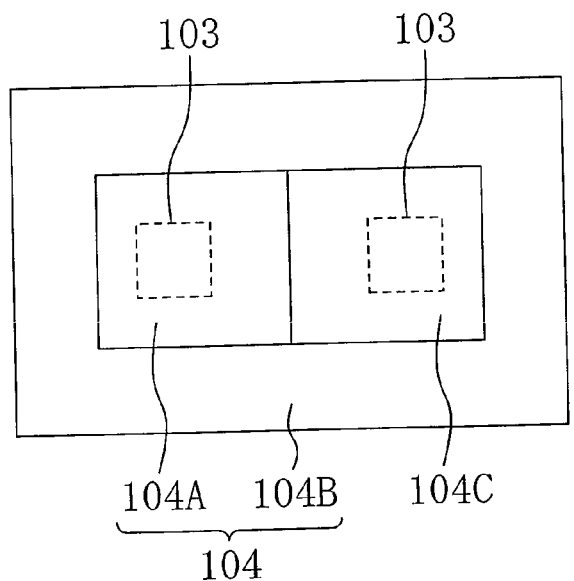
FIG. 3 is a plan view for describing the semiconductor device and the method for fabricating the device of the first embodiment.

FIGS. 1A, 1B, 2A, 2B, 3 and 4 are views for describing the semiconductor device and the method for fabricating the device of the first embodiment. FIGS. 1A, 2A and 2B are cross-sectional views and FIGS. 1B and 3 are plan views.

As shown in FIG. 1A, a silicon oxide film is formed on a silicon substrate 101, and then the silicon oxide film is etched with a hydrofluoric acid using a resist pattern as a mask, thereby partly removing the silicon oxide film and exposing the silicon substrate 101. Subsequently, the resist is removed, and then high-temperature heat treatment is performed in an oxygen atmosphere. In this manner, the exposed portion of the silicon substrate 101 is oxidized to form a second silicon oxide film 103. In this case, the thermal oxidation increases the thickness of the silicon oxide film firstly formed, thereby forming a first silicon oxide film 102. At this time, the second silicon oxide film 103 is formed to have a thickness which allows easy tunneling of charge.

Next, a polysilicon film 104 is deposited over the first silicon oxide film 102 and the second silicon oxide film 103. Thereafter, boron (B) ions are implanted using a resist pattern as a mask, thereby defining a p-type semiconductor region 104A in the polysilicon film 104. At this time, as shown in FIG. 1B, the p-type semiconductor region 104A is surrounded with an undoped semiconductor region 104B and isolated in the shape of an island. The second silicon oxide film 103 is present under the isolated p-type semiconductor region 104A. Subsequently, a third silicon oxide film 105 is formed on the polysilicon film 104, is subjected to heat treatment at 750° C., and then is etched with a buffered hydrofluoric acid using a resist pattern as a mask, so that the third silicon oxide film 105 is removed except for portions where a resistor and a capacitor are to be formed, thereby forming a silicon oxide film 105A (see FIGS. 2A and 2B). In this case, the second silicon oxide film 103 serves as a leakage path so that charge in the p-type semiconductor region 104 is emitted toward the silicon substrate 101 through the second silicon oxide film 103. Accordingly, it is possible to prevent polysilicon from disappearing during etching.

Thereafter, in the case of forming a polymetal gate, a TiN film 106, a W film 107 and a SiN film 108 are deposited and then patterned, thereby forming a polymetal gate electrode together with a polysilicon resistor and a capacitor, as shown in FIGS. 2A and 2B. Specifically, the TiN film 106 and the W film 107 are deposited in this order, and then the SiN film 108 is deposited under a reduced pressure. Then, a resist is formed over the SiN film 108 and then patterning is performed in the manner that the resist remains on portions to be both edges of a polysilicon resistor, a portion to be a gate electrode and a portion to be a capacitor. Thereafter, the SiN film 108 is patterned by dry etching to serve as a hard mask. Then, after the resist has been removed, dry etching is performed, thereby forming a polymetal gate electrode, a polysilicon resistor and a capacitor.

The second silicon oxide film 103 serving as a leakage path for charge may be formed under the isolated island p-type semiconductor region 104A and located at a position where a polysilicon resistor is to be formed, as shown in FIG. 2A, or may be formed at a position where a gate electrode or a capacitor is to be formed. Alternatively, as shown in FIG. 2B, the second silicon oxide film 103 may be formed at a position where no gate is present after gate dry etching or may be formed at a position where a dummy gate is to be formed.

In the foregoing description, the p-type semiconductor region 104A is defined in the polysilicon film 104. Alternatively, an n-type semiconductor region may be defined instead of the p-type semiconductor region 104A. In such a case, the n-type semiconductor region is surrounded with the undoped semiconductor region, and the second silicon oxide film 103 needs to be formed under the isolated island n-type semiconductor region, as in the case of the p-type semiconductor region 104A.

As long as the semiconductor region of a conductivity type defined in the polysilicon film 104 is surrounded with the undoped semiconductor region, silicon constituting the semiconductor region of the conductivity type is not limited to either one of n-type and p-type in general. As shown in FIG. 3, a mixed structure of one or more n-type semiconductor regions 104C and one or more p-type semiconductor regions 104A may be surrounded with the undoped semiconductor region 104B. In such a case, the second silicon oxide film 103 is preferably formed under each of the p-type semiconductor regions 104A and the n-type semiconductor regions 104C.

Figure 4:
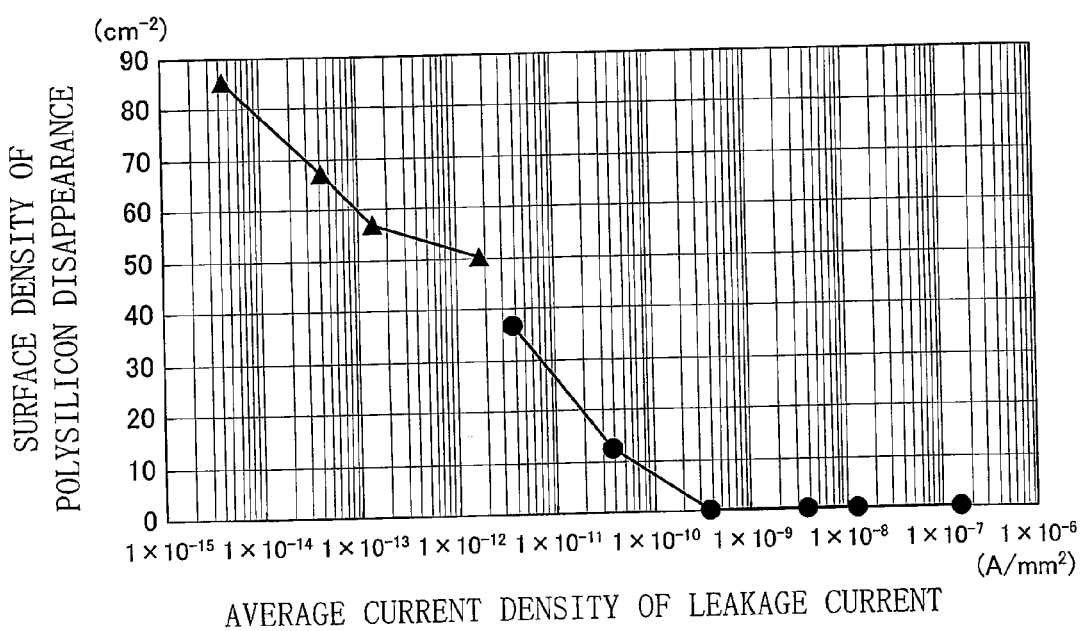
FIG. 4 is a graph showing a relationship between the average current density of leakage current and the surface density of the disappearance of polysilicon.

Now, FIG. 4 shows a relationship between the average current density of leakage current from the p-type semiconductor region 104A to the silicon substrate 101 and the surface density of the disappearance of polysilicon. In FIG. 4, evaluation is made using devices fabricated with the area ratio between the first and second silicon oxide films 102 and 103 and the thickness of the second silicon oxide film 103 changed variously and with the area of the p-type semiconductor region 104A kept constant.

As shown in FIG. 4, the surface density of the disappearance of polysilicon decreases as the average current density of leakage current increases. When the average current density is $1 \times 10^{-10}$ (A/mm$^2$) or more, no disappearance of polysilicon occurs. In this evaluation, the silicon substrate 101 is p-type and a voltage of 1.5 V is applied as a measurement voltage in a direction that makes charge accumulated in the silicon substrate 101. The average current density of leakage current is herein obtained by dividing current flowing from each island p-type semiconductor region by the area occupied by this semiconductor region.

Embodiment 2

Hereinafter, a semiconductor device and a method for fabricating the semiconductor device according to a second embodiment of the present invention will be described with reference to FIGS. 5A through 5C.

FIGS. 5A through 5C are views for describing the semiconductor device and the method for fabricating the device of the second embodiment. FIG. 5A is a cross-sectional view and FIGS. 5B and 5C are plan views.

As shown in FIG. 5A, a first silicon oxide film 202 is formed on a silicon substrate 201, and then a polysilicon film 203 is deposited over the first silicon oxide film 202. Subsequently, boron (B) ions are implanted using a resist pattern as a mask, thereby defining a p-type semiconductor region 203A in the polysilicon film 203. At this time, as shown in FIG. 5B, the p-type semiconductor region 203A is surrounded with an undoped semiconductor region 203B and isolated in the shape of an island. Thereafter, a second silicon oxide film 204 is formed on the polysilicon oxide film 203. Then, etching is performed with a hydrofluoric acid using a resist pattern as a mask, thereby removing the second silicon oxide film 204 except for portions where a resistor and a capacitor are to be formed. In this case, no heat treatment is performed on the second silicon oxide film 204 so that the second silicon oxide film 204 has a high leakage current density, while being an insulating film. Accordingly, the second silicon oxide film 204 serves as a leakage path for charge in the p-type semiconductor region 203A so that charge in the p-type semiconductor region 203A is emitted to the outside through the second silicon oxide film 204. As a result, it is possible to prevent polysilicon from disappearing during etching.

Thereafter, in the case of forming a polymetal gate, a TiN film, a W film and a SiN film are deposited and then patterned, thereby forming a polymetal gate electrode together with a polysilicon resistor and a capacitor (not shown). Specifically, the TiN film and the W film are deposited in this order, and then the SiN film is deposited under a reduced pressure. Then, a resist is formed over the SiN film and then patterning is performed in the manner that the resist remains on portions to be both edges of a polysilicon resistor, a portion to be a gate electrode and a portion to be a capacitor. Thereafter, the SiN film is patterned by dry etching to serve as a hard mask. Then, after the resist has been removed, dry etching is performed, thereby forming a polymetal gate electrode, a polysilicon resistor and a capacitor.

In the foregoing description, the p-type semiconductor region 203A is defined in the polysilicon film 203. Alternatively, an n-type semiconductor region may be defined instead of the p-type semiconductor region 203A. In such a case, the n-type semiconductor region is surrounded with the undoped semiconductor region.

As long as the semiconductor region of a conductivity type defined in the polysilicon film 203 is surrounded with the undoped semiconductor region, silicon constituting the semiconductor region of the conductivity type is not limited to either one of n-type and p-type in general. As shown in FIG. 5C, a mixed structure of one or more n-type semiconductor regions 203C and one or more p-type semiconductor regions 203A may be surrounded with the undoped semiconductor region 203B.

Embodiment 3

Hereinafter, a semiconductor device and a method for fabricating the semiconductor device according to a third embodiment of the present invention will be described with reference to FIGS. 6A, 6B, 7A, 7B and 8.

Figure 6A:
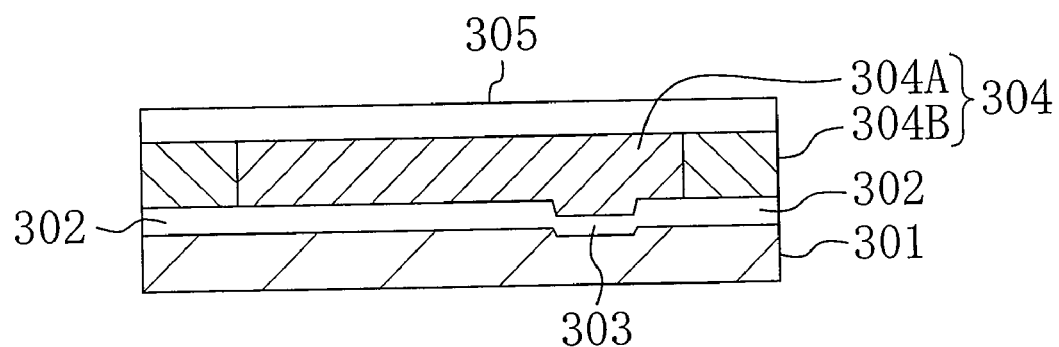
FIG. 6A is a cross-sectional view for describing a semiconductor device and a method for fabricating the device according to a third embodiment of the present invention.
Figure 6B:
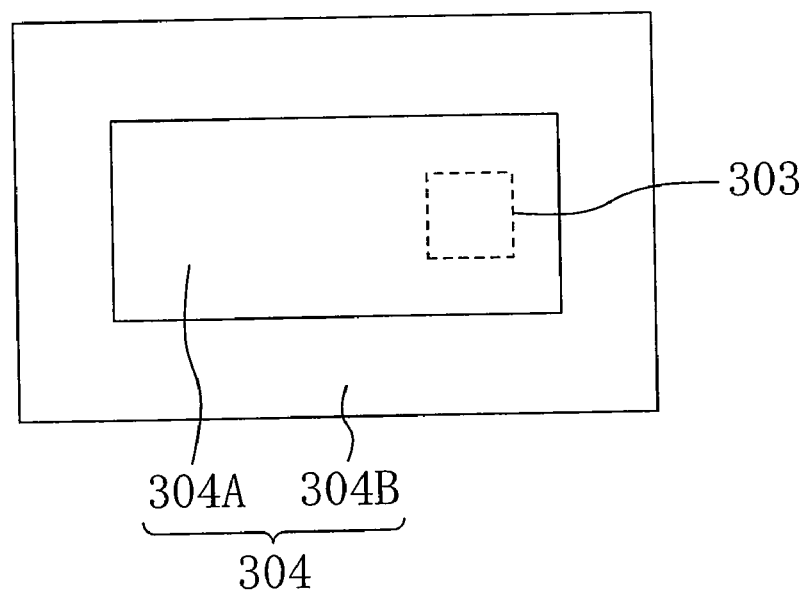
FIG. 6B is a plan view for describing the semiconductor device and the method for fabricating the device of the third embodiment.
Figure 7A:
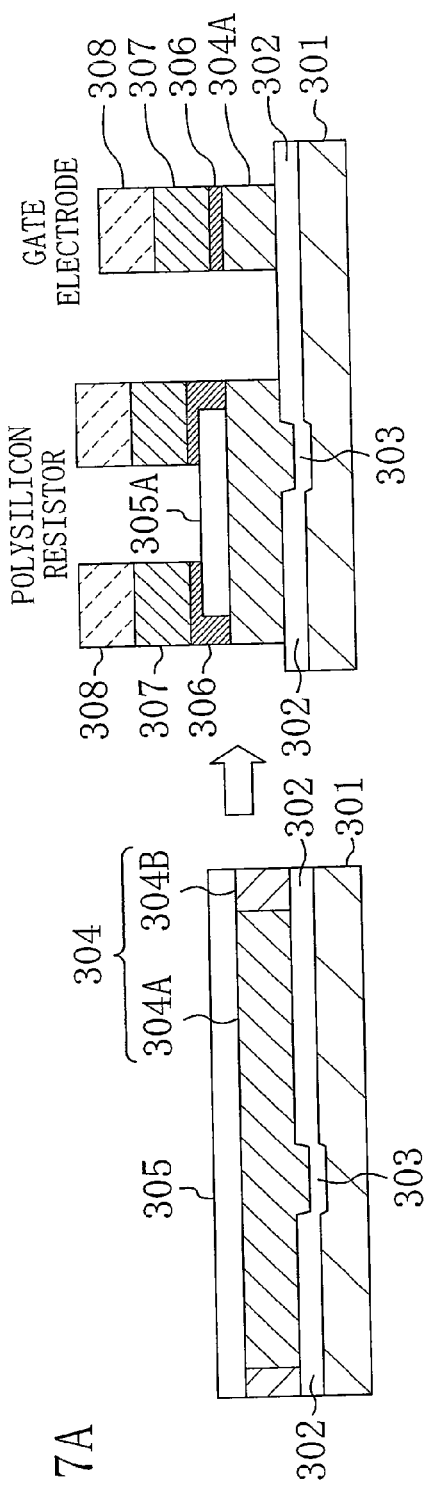
FIGS. 7A and 7B are cross-sectional views for describing the semiconductor device and the method for fabricating the device of the third embodiment.
Figure 7B:
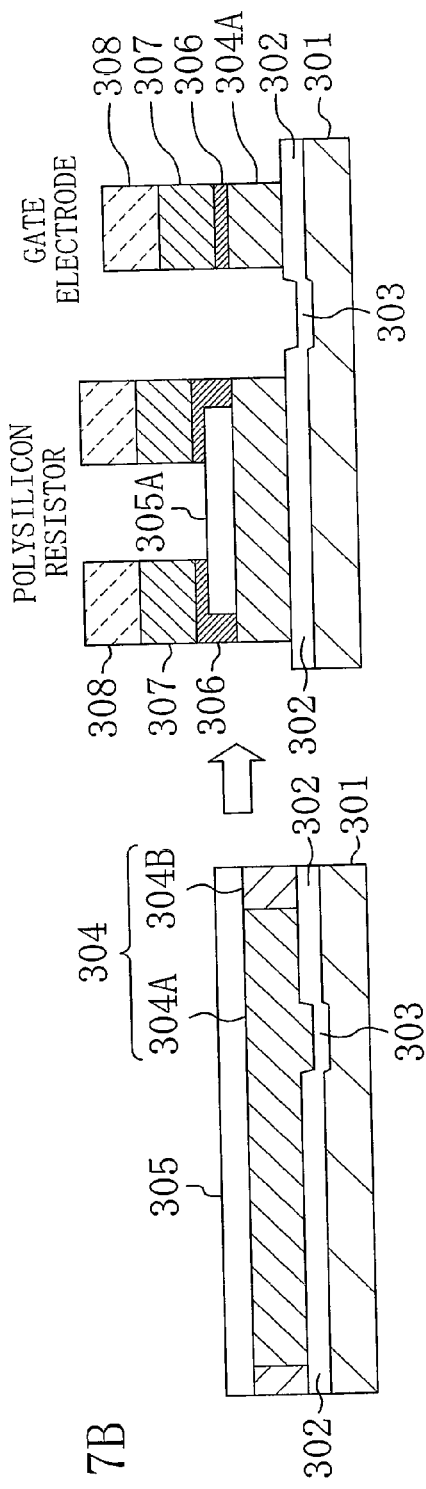
Figure 8:
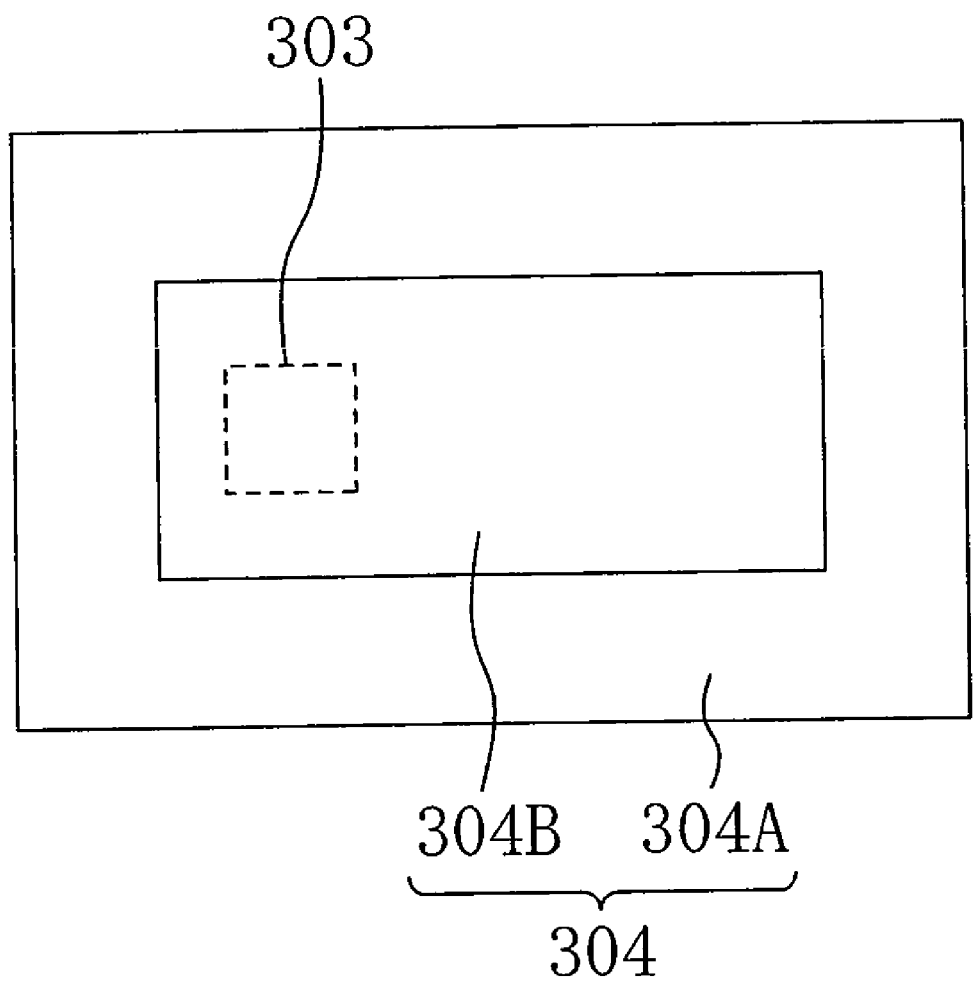
FIG. 8 is a plan view for describing the semiconductor device and the method for fabricating the device of the third embodiment.

FIGS. 6A, 6B, 7A, 7B and 8 are views for describing the semiconductor device and the method for fabricating the device of the third embodiment. FIGS. 6A, 7A and 7B are cross-sectional views and FIGS. 6B and 8 are plan views.

As shown in FIG. 6A, a silicon oxide film is formed on a silicon substrate 301, and then the silicon oxide film is etched with a hydrofluoric acid using a resist pattern as a mask, thereby partly removing the silicon oxide film and exposing the silicon substrate 301. Subsequently, the resist is removed, and then high-temperature heat treatment is performed in an oxygen atmosphere. In this manner, the exposed portion of the silicon substrate 301 is oxidized to form a second silicon oxide film 303. In this case, the thermal oxidation increases the thickness of the silicon oxide film firstly formed, thereby forming a first silicon oxide film 302. At this time, the second silicon oxide film 303 is formed to have a thickness which allows easy tunneling of charge.

Next, a polysilicon film 304 is deposited over the first silicon oxide film 302 and the second silicon oxide film 303. Thereafter, boron (B) ions are implanted using a resist pattern as a mask, thereby defining a p-type semiconductor region 304A in the polysilicon film 304. Subsequently, phosphorus (P) ions are implanted using a resist pattern as a mask, thereby defining an n-type semiconductor region 304B in the polysilicon film 304. At this time, as shown in FIG. 6B, the p-type semiconductor region 304A is surrounded with the n-type semiconductor region 304B and isolated in the shape of an island. The second silicon oxide film 303 is present under the isolated p-type semiconductor region 304A. Subsequently, a third silicon oxide film 305 is formed on the polysilicon film 304, is subjected to heat treatment at 750° C., and then is etched with a buffered hydrofluoric acid using a resist pattern as a mask so that the third silicon oxide film 305 is removed except for portions where a resistor and a capacitor are to be formed, thereby forming a silicon oxide film 305A (see FIGS. 7A and 7B). In this case, the second. silicon oxide film 303 serves as a leakage path so that charge in the p-type semiconductor region 304 is emitted toward the silicon substrate 301 through the second silicon oxide film 303. Accordingly, it is possible to prevent polysilicon from disappearing during etching.

Thereafter, in the case of forming a polymetal gate, a TiN film 306, a W film 307 and a SiN film 308 are deposited and then patterned, thereby forming a polymetal gate electrode together with a polysilicon resistor and a capacitor, as shown in FIGS. 7A and 7B. Specifically, the TiN film 306 and the W film 307 are deposited in this order, and then the SiN film 308 is deposited under a reduced pressure. Then, a resist is formed over the SiN film 308 and then patterning is performed in the manner that the resist remains on portions to be both edges of a polysilicon resistor, a portion to be a gate electrode and a portion to be a capacitor. Thereafter, the SiN film 308 is patterned by dry etching to serve as a hard mask. Then, after the resist has been removed, dry etching is performed, thereby forming a polymetal gate electrode, a polysilicon resistor and a capacitor.

The second silicon oxide film 303 serving as a leakage path for charge may be formed under the isolated island p-type semiconductor region 304A to be located at a position where a polysilicon resistor is to be formed as shown in FIG. 7A, or may be formed at a position where a gate electrode or a capacitor is to be formed. Alternatively, as shown in FIG. 7B, the second silicon oxide film 303 may be formed at a position where no gate is present after gate dry etching or may be formed at a position where a dummy gate is to be formed.

In the foregoing description, the p-type semiconductor region 304A is defined within the n-type semiconductor region 304B. Alternatively, the n-type semiconductor region 304B and the p-type semiconductor region 304A may be replaced with each other. In such a case, as shown in FIG. 8, the n-type semiconductor region 304B is surrounded with the p-type semiconductor region 304A, and the second silicon oxide film 303 needs to be formed under the isolated island n-type semiconductor region 304B.

Embodiment 4

Hereinafter, a semiconductor device and a method for fabricating the semiconductor device according to a fourth embodiment of the present invention will be described with reference to FIGS. 9A through 9C.

Figure 9A:
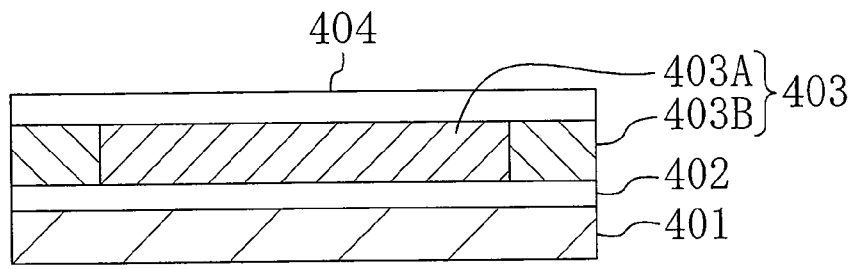
FIG. 9A is a cross-sectional view for describing a semiconductor device and a method for fabricating the device according to a fourth embodiment of the present invention.
Figure 9B:
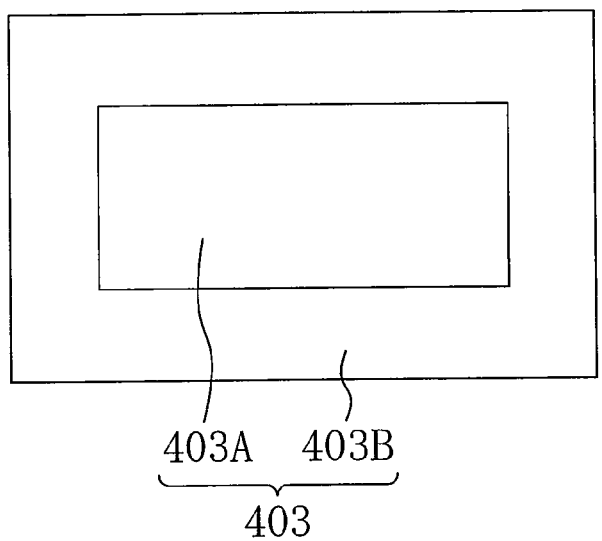
FIGS. 9B and 9C are plan views for describing the semiconductor device and the method for fabricating the device of the fourth embodiment.
Figure 9C:
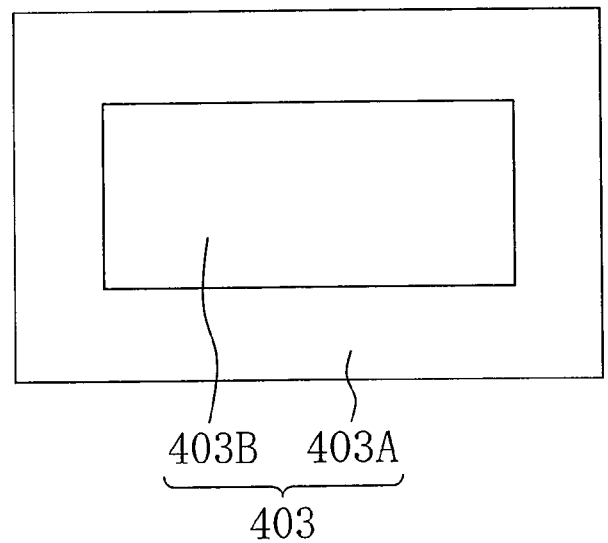

FIGS. 9A through 9C are views for describing the semiconductor device and the method for fabricating the device of the fourth embodiment. FIG. 9A is a cross-sectional view and FIGS. 9B and 9C are plan views.

As shown in FIG. 9A, a first silicon oxide film 402 is formed on a silicon substrate 401, and then a polysilicon film 403 is deposited over the first silicon oxide film 402. Subsequently, boron (B) ions are implanted using a resist pattern as a mask, thereby defining a p-type semiconductor region 403A in the polysilicon film 403. Thereafter, phosphorus (P) ions are implanted using a resist pattern as a mask, thereby defining an n-type semiconductor region 403B in the polysilicon film 403. At this time, as shown in FIG. 9B, the p-type semiconductor region 403A is surrounded with the n-type semiconductor region 403B and isolated in the shape of an island. Thereafter, a second silicon oxide film 404 is formed on the polysilicon oxide film 403. Then, etching is performed with a hydrofluoric acid using a resist pattern as a mask, thereby removing the second silicon oxide film 404 except for portions where a resistor and a capacitor are to be formed. In this case, no heat treatment is performed on the second silicon oxide film 404 so that the second silicon oxide film 404 has a high leakage current density, while being an insulating film. Accordingly, the second silicon oxide film 404 serves as a leakage path for charge in the p-type semiconductor region 403A so that charge in the p-type semiconductor region 403A is emitted to the outside through the second silicon oxide film 404. As a result, it is possible to prevent polysilicon from disappearing during etching.

Thereafter, in the case of forming a polymetal gate, a TiN film, a W film and a SiN film are deposited and then patterned, thereby forming a polymetal gate electrode together with a polysilicon resistor and a capacitor (not shown). Specifically, the TiN film and the W film are deposited in this order, and then the SiN film is deposited under a reduced pressure. Then, a resist is formed over the SiN film and then patterning is performed in the manner that the resist remains on portions to be both edges of a polysilicon resistor, a portion to be a gate electrode and a portion to be a capacitor. Thereafter, the SiN film is patterned by dry etching to serve as a hard mask. Then, after the resist has been removed, dry etching is performed, thereby forming a polymetal gate electrode, a polysilicon resistor and a capacitor.

In the foregoing description, the p-type semiconductor region 404A is defined within the n-type semiconductor region 404B. Alternatively, the n-type semiconductor region 404B and the p-type semiconductor region 404A may be replaced with each other. In such a case, as shown in FIG. 9C, the n-type semiconductor region 404B is surrounded with the p-type semiconductor region 404A.

Embodiment 5

Hereinafter, a semiconductor device and a method for fabricating the semiconductor device according to a fifth embodiment of the present invention will be described with reference to FIGS. 10A through 10D.

FIGS. 10A through 10D are cross-sectional views showing the semiconductor device and the method for fabricating the device of the fifth embodiment.

Figure 10A:
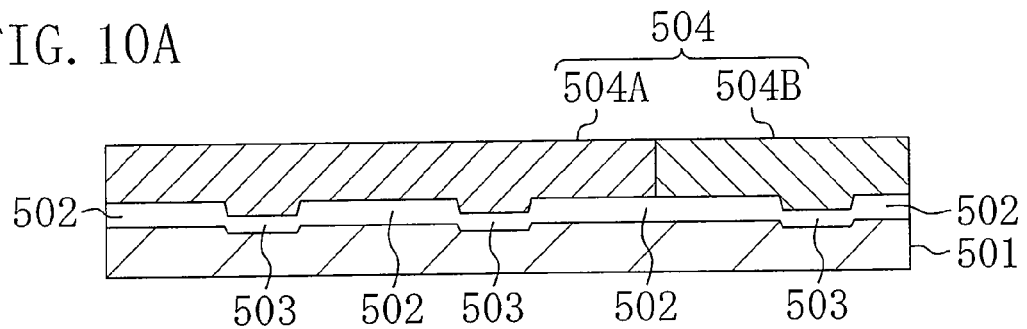
FIGS. 10A through 10D are cross-sectional views for describing a semiconductor device and a method for fabricating the device according to a fifth embodiment of the present invention.

As shown in FIG. 10A, a silicon oxide film is formed on a silicon substrate 501, and then the silicon oxide film is etched with a hydrofluoric acid using a resist pattern as a mask, thereby partly removing the silicon oxide film and exposing the silicon substrate 501. Subsequently, the resist is removed, and then high-temperature heat treatment is performed in an oxygen atmosphere. In this manner, the exposed portion of the silicon substrate 501 is oxidized to form a second silicon oxide film 503. In this case, the thermal oxidation increases the thickness of the silicon oxide film firstly formed, thereby forming a first silicon oxide film 502. At this time, the second silicon oxide film 503 is formed to have a thickness which allows easy tunneling of charge.

Figure 10B:
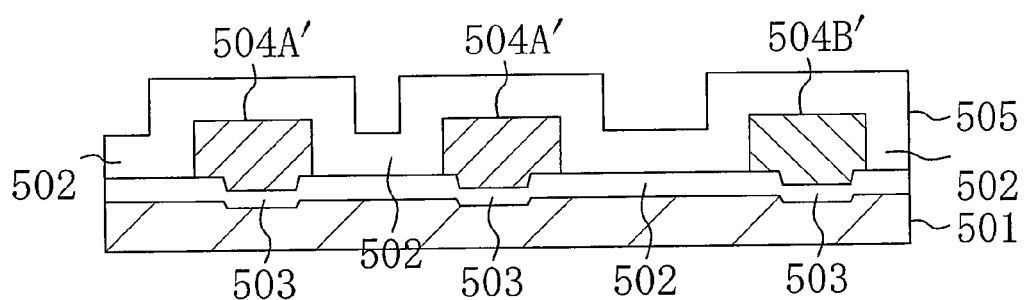

Next, a polysilicon film 504 is deposited over the first silicon oxide film 502 and the second silicon oxide film 503. Thereafter, boron (B) ions are implanted using a resist pattern as a mask, thereby defining a p-type semiconductor region 504A in the polysilicon film 504. Subsequently, phosphorus (P) ions are implanted using a resist pattern as a mask, thereby defining an n-type semiconductor region 504B in the polysilicon film 504. Then, as shown in FIG. 10B, patterning is performed to form patterned p-type and n-type semiconductor regions 504A' and 504B' out of the p-type and n-type semiconductor regions 504A and 504B shown in FIG. 10A, respectively. Thereafter, a third silicon oxide film 505 is deposited and subjected to heat treatment at 750° C. At this time, as shown in FIG. 10B, each of the patterned p-type and n-type semiconductor regions 504A' and 504B' is surrounded with the first silicon oxide film 502, the second silicon oxide film 503 and the third silicon oxide film 505 on all sides vertically and horizontally, and the second silicon oxide film 503 is present under each of the isolated patterned p-type and n-type semiconductor regions 504A' and 504B'. In this case, the second silicon oxide film 503 serves as a leakage path so that charge in the patterned p-type and n-type semiconductor regions 504A' and 504B' is emitted toward the silicon substrate 501 through the second silicon oxide film 503. Accordingly, it is possible to prevent polysilicon from disappearing during etching.

Figure 10C:
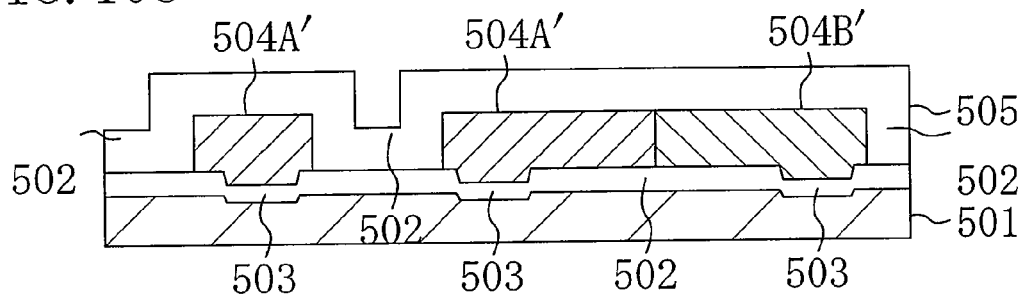

As shown in FIG. 10C, if there is a region in which the patterned p-type and n-type semiconductor regions 504A' and 504B' are continuous, the second silicon oxide film 503 is preferably formed under each of the patterned p-type and n-type semiconductor regions 504A' and 504B'.

Figure 10D:
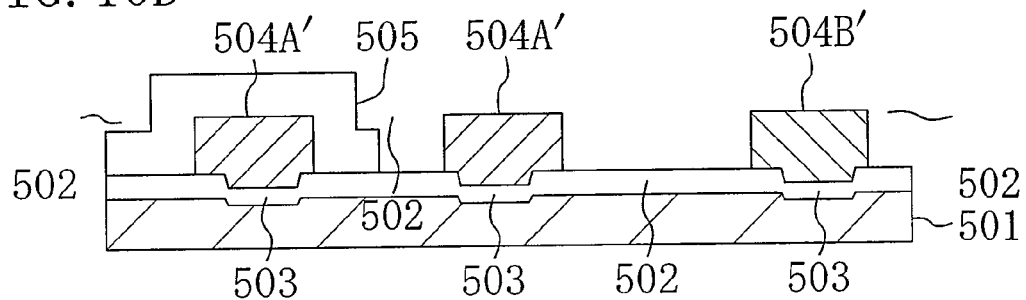

Then, as shown in FIG. 10D, etching is performed with a buffered hydrofluoric acid using a resist pattern as a mask, thereby partly removing the third silicon oxide film 505. In this case, the second silicon oxide film 503 serves as a leakage path so that it is possible to prevent polysilicon from disappearing during etching.

Embodiment 6

Hereinafter, a semiconductor device and a method for fabricating the semiconductor device according to a sixth embodiment of the present invention will be described with reference to FIGS. 11A through 11D.

FIGS. 11A through 11D are cross-sectional views showing the semiconductor device and the method for fabricating the device of the sixth embodiment.

Figure 11A:
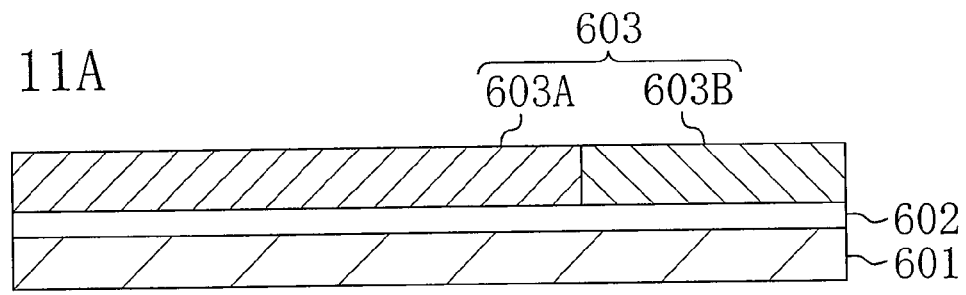
FIGS. 11A through 11D are cross-sectional views for describing a semiconductor device and a method for fabricating the device according to a sixth embodiment of the present invention.
Figure 11B:
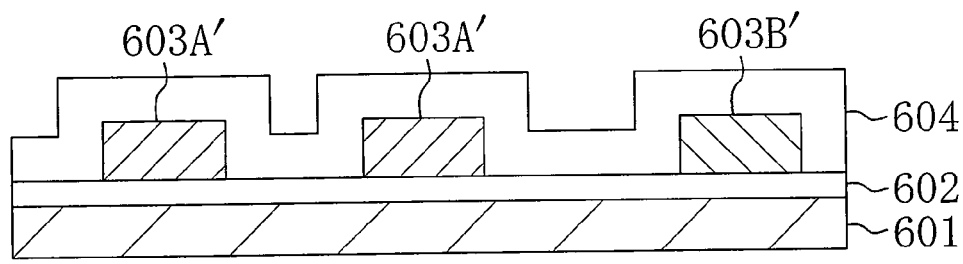
Figure 11C:
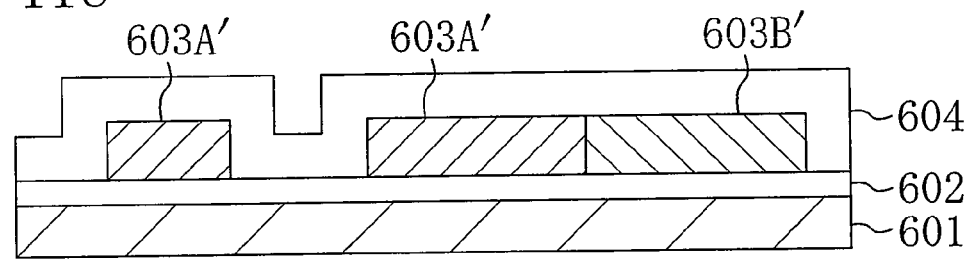
Figure 11D:
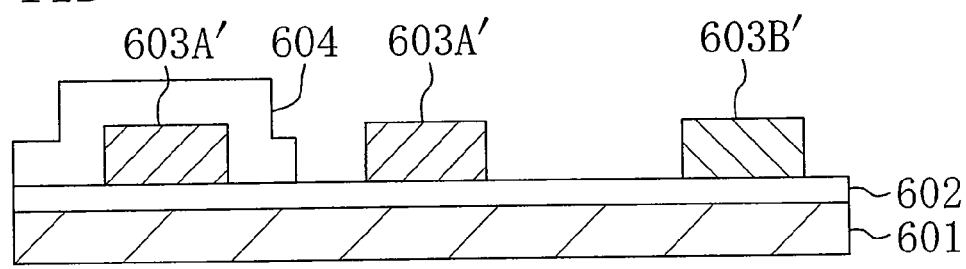

As shown in FIG. 11A, a first silicon oxide film 602 is formed on a silicon substrate 601, and then a polysilicon film 603 is deposited over the first silicon oxide film 602. Thereafter, boron (B) ions are implanted using a resist pattern as a mask, thereby defining a p-type semiconductor region 603A in the polysilicon film 603. Subsequently, phosphorus (P) ions are implanted using a resist pattern as a mask, thereby defining an n-type semiconductor region 603B in the polysilicon film 603. Then, as shown in FIG. 11B, patterning is performed to form patterned p-type and n-type semiconductor regions 603A' and 603B' out of the p-type and n-type semiconductor regions 603A and 603B shown in FIG. 11A, respectively. Thereafter, a second silicon oxide film 604 is deposited. At this time, as shown in FIG. 11B, each of the patterned p-type and n-type semiconductor regions 603A' and 603B' is surrounded with the first silicon oxide film 602, the second silicon oxide film 604 on all sides vertically and horizontally. In this case, no heat treatment is performed on the second silicon oxide film 604 so that the second silicon oxide film 604 has a high leakage current density, while being an insulating film. Accordingly, the second silicon oxide film 604 serves as a leakage path for charge in the patterned p-type and n-type semiconductor regions 603A' and 603B'. That is to say, charge in the patterned p-type and n-type semiconductor regions 603A' and 603B' is emitted to the outside through the second silicon oxide film 604. As shown in FIG. 11C, there may be a region in which the patterned p-type and n-type semiconductor regions 603A' and 603B' are continuous.

Then, as shown in FIG. 1D, etching is performed with a buffered hydrofluoric acid using a resist pattern as a mask, thereby partly removing the second silicon oxide film 604. During this etching, the second silicon oxide film 604 serves as a leakage path so that it is possible to prevent polysilicon from disappearing.

Embodiment 7

Hereinafter, a semiconductor device and a method for fabricating the semiconductor device according to a seventh embodiment of the present invention will be described with reference to FIG. 12.

Figure 12:
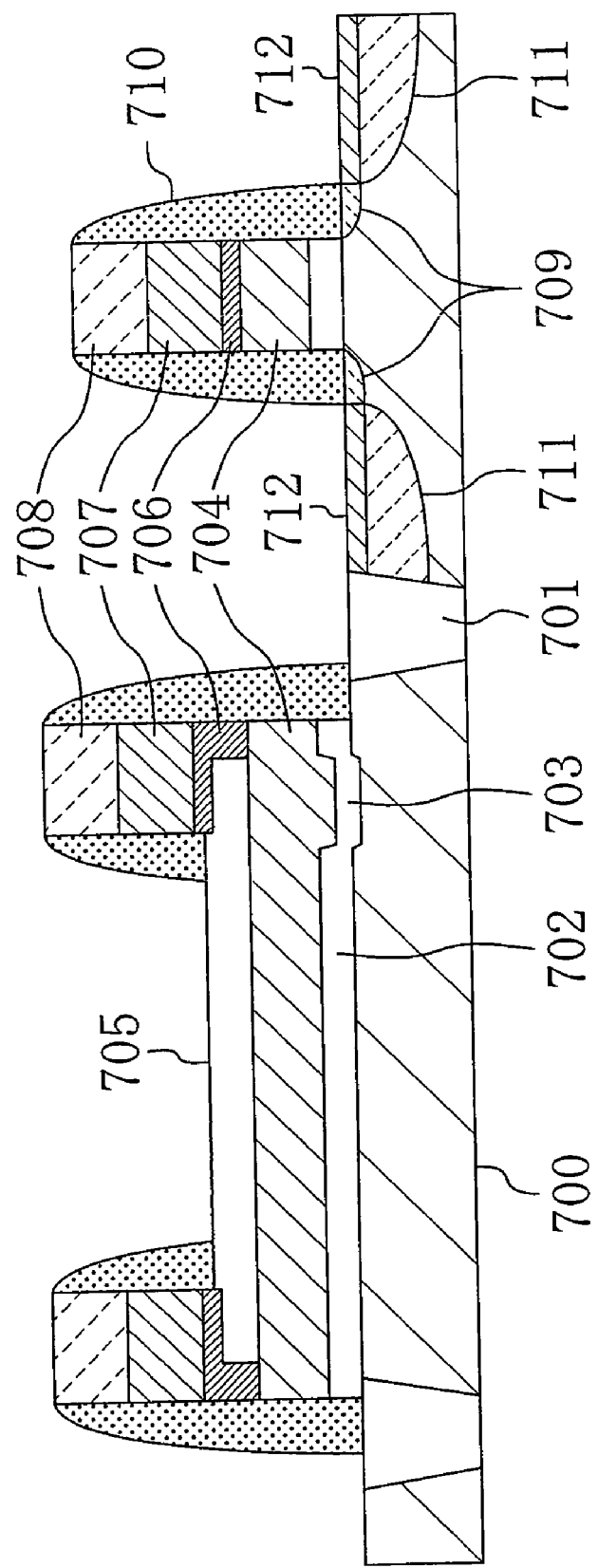
FIG. 12 is a cross-sectional view for describing a semiconductor device and a method for fabricating the device according to a seventh embodiment of the present invention.

FIG. 12 is a cross-sectional view for describing the semiconductor device and the method for fabricating the device of the seventh embodiment.

As shown in FIG. 12, isolations 701 are formed in a silicon substrate 700, and then a polymetal gate electrode and a polysilicon resistor are formed in the same manner as in the third embodiment.

Specifically, a silicon oxide film is formed on the silicon substrate 700, and then the silicon oxide film is etched with a hydrofluoric acid using a resist pattern as a mask, thereby partly removing the silicon oxide film and exposing the silicon substrate 700. Subsequently, the resist is removed, and then high-temperature heat treatment is performed in an oxygen atmosphere. In this manner, the exposed portion of the silicon substrate 700 is oxidized to form a second silicon oxide film 703. In this case, the thermal oxidation increases the thickness of the silicon oxide film firstly formed, thereby forming a first silicon oxide film 702. At this time, the second silicon oxide film 703 is formed to have a thickness which allows easy tunneling of charge.

Next, a polysilicon film 704 is deposited over the first silicon oxide film 702 and the second silicon oxide film 703. Thereafter, boron (B) ions are implanted using a resist pattern as a mask, thereby defining a p-type semiconductor region in the polysilicon film 704. Subsequently, phosphorus (P) ions are implanted using a resist pattern as a mask, thereby defining an n-type semiconductor region in the polysilicon film 704. Thereafter, a third silicon oxide film is formed on the p-type semiconductor region, is subjected to heat treatment at 750° C., and then is etched with a buffered hydrofluoric acid using a resist pattern as a mask so that the third silicon oxide film is removed except for portions where a resistor and a capacitor are to be formed, thereby forming a silicon oxide film 705. At this time, the second silicon oxide film 703 serves as a leakage path so that charge in the p-type semiconductor region (or n-type semiconductor region) is emitted toward the silicon substrate 700 through the second silicon oxide film 703. Accordingly, it is possible to prevent polysilicon from disappearing during etching. This effect is the same if the polysilicon film 704 formed under the silicon oxide film 705 is an n-type semiconductor region.

Thereafter, a TiN film 706, a W film 707 and a SiN film 708 are deposited and then patterned, thereby forming a polysilicon resistor, a polymetal gate electrode and a capacitor (not shown). Specifically, the TiN film 706 and the W film 707 are deposited in this order, and then the SiN film 708 is deposited under a reduced pressure. Then, a resist is formed over the SiN film 708 and then patterning is performed in the manner that the resist remains on portions to be both edges of a polysilicon resistor, a portion to be a gate electrode and a portion to be a capacitor. Thereafter, the SiN film 708 is patterned by dry etching to serve as a hard mask. Then, after the resist has been removed, dry etching is performed, thereby forming a polysilicon resistor, a polymetal gate electrode and a capacitor.

Then, the silicon substrate 700 is doped with an impurity using the polymetal gate electrode as a mask, thereby forming a lightly doped layer 709. Subsequently, a silicon nitride film is deposited over the entire surface of the silicon substrate 700, and then is subjected to anisotropic etching, thereby forming a sidewall 710 on the side of the gate electrode. Thereafter, the silicon substrate 700 is doped with an impurity using the polymetal gate electrode and the sidewall 710 as a mask, thereby forming a heavily doped layer 711.

Then, heat treatment is performed on the silicon substrate 700 to activate the lightly doped layer 709 and the heavily doped layer 711. Thereafter, a cobalt film is formed, and finally a cobalt silicide film 712 is formed by heat treatment in the surface of source and drain regions. In this manner, a semiconductor device including an MOS transistor, a polysilicon resistor or a capacitor is fabricated.

Embodiment 8

Hereinafter, a semiconductor device and a method for fabricating the semiconductor device according to an eighth embodiment of the present invention will be described with reference to FIG. 13.

Figure 13:
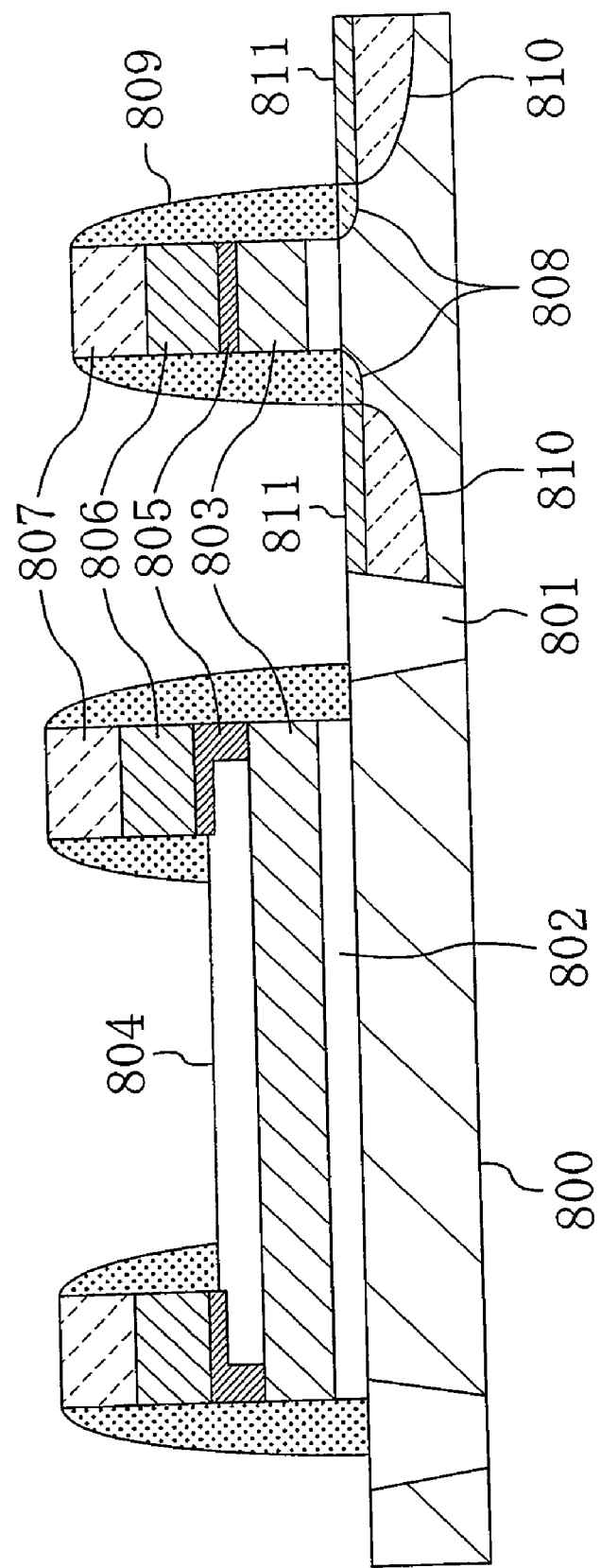
FIG. 13 is a cross-sectional view for describing a semiconductor device and a method for fabricating the device according to an eighth embodiment of the present invention.

FIG. 13 is a cross-sectional view for describing the semiconductor device and the method for fabricating the device of the eighth embodiment.

As shown in FIG. 13, isolations 801 are formed in a silicon substrate 800, and then a polymetal gate electrode and a polysilicon resistor are formed in the same manner as in the fourth embodiment.

Specifically, a first silicon oxide film 802 is formed on the silicon substrate 800, and then a polysilicon film 803 is deposited over the first silicon oxide film 802. Thereafter, boron (B) ions are implanted using a resist pattern as a mask, thereby defining a p-type semiconductor region in the polysilicon film 803. Subsequently, phosphorus (P) ions are implanted using a resist pattern as a mask, thereby defining an n-type semiconductor region in the polysilicon film 803. At this time, the p-type semiconductor region is surrounded with the n-type semiconductor region and isolated in the shape of an island. Subsequently, a second silicon oxide film is formed on the polysilicon film 803, and then is etched with a buffered hydrofluoric acid using a resist pattern as a mask so that the second silicon oxide film is removed except for portions where a resistor and a capacitor are to be formed, thereby forming a silicon oxide film 804. In this case, no heat treatment is performed on the second silicon oxide film so that the second silicon oxide film has a high leakage current density, while being an insulating film. Accordingly, the second silicon oxide film serves as a leakage path for charge in the p-type semiconductor region so that charge in the p-type semiconductor region is emitted to the outside through the second silicon oxide film. As a result, it is possible to prevent polysilicon from disappearing during etching. This effect is the same if the polysilicon film 803 formed under the silicon oxide film 804 is an n-type semiconductor region.

Thereafter, a TiN film 805, a W film 806 and a SiN film 807 are deposited and then patterned, thereby forming a polysilicon resistor, a polymetal gate electrode and a capacitor (not shown). Specifically, the TiN film 805 and the W film 806 are deposited in this order, and then the SiN film 807 is deposited under a reduced pressure. Then, a resist is formed over the SiN film 807 and then patterning is performed in the manner that the resist remains on portions to be both edges of a polysilicon resistor, a portion to be a gate electrode and a portion to be a capacitor. Thereafter, the SiN film 807 is patterned by dry etching to serve as a hard mask. Then, after the resist has been removed, dry etching is performed, thereby forming a polysilicon resistor, a polymetal gate electrode and a capacitor.

Then, the silicon substrate 800 is doped with an impurity using the polymetal gate electrode as a mask, thereby forming a lightly doped layer 808. Subsequently, a silicon nitride film is deposited over the entire surface of the silicon substrate 800, and then is subjected to anisotropic etching, thereby forming a sidewall 809 on the side of the gate electrode. Thereafter, the silicon substrate 800 is doped with an impurity using the polymetal gate electrode and the sidewall 809 as a mask, thereby forming a heavily doped layer 810.

Then, heat treatment is performed on the silicon substrate 800 to activate the lightly doped layer 808 and the heavily doped layer 810. Thereafter, a cobalt film is formed, and finally a cobalt silicide film 811 is formed by heat treatment in the surface of source and drain regions. In this manner, a semiconductor device including an MOS transistor, a polysilicon resistor or a capacitor is formed.

Embodiment 9

Hereinafter, a semiconductor device and a method for fabricating the semiconductor device according to a ninth embodiment of the present invention will be described with reference to FIGS. 14A and 14B.

Figure 14A:
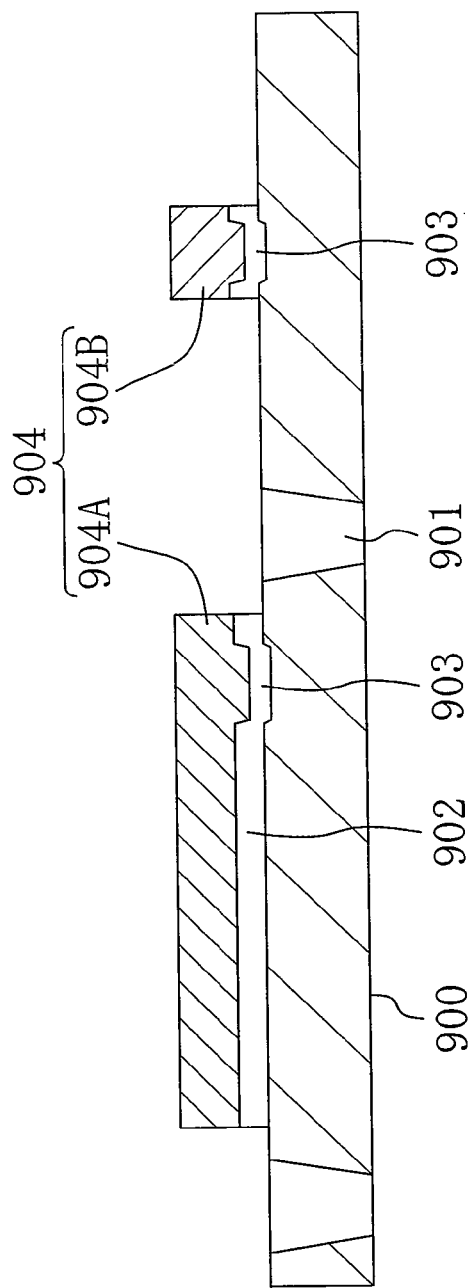
FIGS. 14A and 14B are cross-sectional views for describing a semiconductor device and a method for fabricating the device according to a ninth embodiment of the present invention.
Figure 14B:
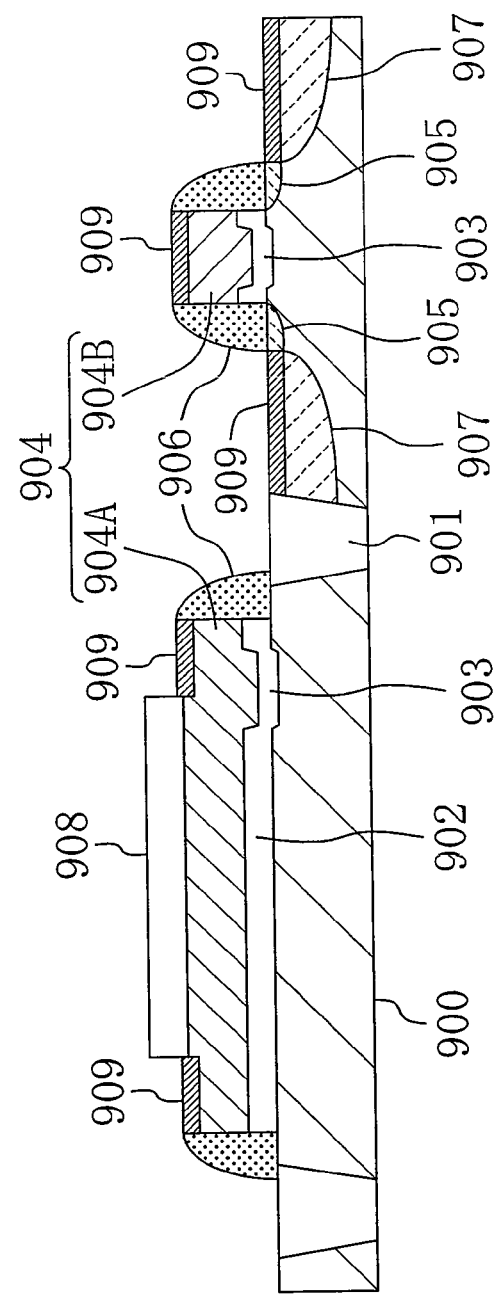

FIGS. 14A and 14B are cross-sectional views for describing the semiconductor device and the method for fabricating the device of the ninth embodiment.

As shown in FIG. 14A, isolations 901 are formed in a silicon substrate 900. Subsequently, a silicon oxide film is formed on the silicon substrate 900 and then is etched with a hydrofluoric acid using a resist pattern as a mask, thereby partly removing the silicon oxide film and exposing the substrate 900. Thereafter, the resist is removed, and then high-temperature heat treatment is performed in an oxygen atmosphere. In this manner, the exposed portion of the silicon substrate 900 is oxidized to form a second silicon oxide film 903. In this case, the thermal oxidation increases the thickness of the silicon oxide film firstly formed, thereby forming a first silicon oxide film 902. At this time, the second silicon oxide film 903 is formed to have a thickness which allows easy tunneling of charge.

Next, a polysilicon film 904 is deposited over the first silicon oxide film 902 and the second silicon oxide film 903. Thereafter, boron (B) ions are implanted using a resist pattern as a mask, thereby defining a p-type semiconductor region 904A in the polysilicon film 904. Subsequently, phosphorus (P) ions are implanted using a resist pattern as a mask, thereby defining an n-type semiconductor region 904B in the polysilicon film 904. Subsequently, patterning is performed to form patterned p-type and n-type semiconductor regions 904A and 904B.

Then, as shown in FIG. 14B, the silicon substrate 900 is doped with an impurity using the patterned p-type and n-type semiconductor regions 904A and 904B as a mask, thereby forming a lightly doped layer 905. Subsequently, a silicon nitride film is deposited over the entire surface of the silicon substrate 900, and then is subjected to anisotropic etching, thereby forming sidewalls 906 on the sides of the patterned p-type and n-type semiconductor regions 904A and 904B. Thereafter, the silicon substrate 900 is doped with an impurity using the patterned p-type and n-type semiconductor regions 904A and 904B and the sidewalls 906 as a mask, thereby forming a heavily doped layer 907.

Then, heat treatment is performed on the silicon substrate 900 to activate the lightly doped layer 905 and the heavily doped layer 907. With respect to the patterned p-type and n-type semiconductor regions 904A and 904B, implantation of, for example, boron ions may be performed before patterning. That is to say, implantation is not necessarily performed before patterning, and the implantation of the high-concentration impurity may also serve as the implantation for the patterned p-type or n-type semiconductor region 904A or 904B instead. Thereafter, a third silicon oxide film is formed on the p-type and n-type semiconductor regions 904A and 904B and then is heated rapidly at 850° C.

At this time, the patterned p-type and n-type semiconductor regions 904A and 904B are surrounded with the insulating films, which are oxide films, on all sides vertically and horizontally, and the second silicon oxide film 903 is formed under each of the patterned p-type and n-type semiconductor regions 904A and 904B. In this case, the second silicon oxide film 903 serves as a leakage path so that charge in the patterned p-type and n-type semiconductor regions 904A and 904B is emitted toward the silicon substrate 900 through the second silicon oxide film 903. Although not shown, in a case where there is a region in which the patterned p-type and n-type semiconductor regions 904A and 904B are continuous, the second silicon oxide film 903 is preferably formed under each of the patterned p-type and n-type semiconductor regions 904A and 904B.

Then, etching is performed with a hydrofluoric acid using a resist pattern as a mask, thereby removing the third silicon oxide film except for a portion where a resistor is to be formed, thereby forming a silicon oxide film 908. At this time, the second silicon oxide film 903 serves as a leakage path so that charge in the p-type semiconductor region 904A is emitted toward the silicon substrate 900 through the second silicon oxide film 903. As a result, it is possible to prevent polysilicon from disappearing during etching.

Subsequently, a cobalt silicide film 909 is formed in the heavily doped layer 907 and the patterned p-type and n-type semiconductor regions 904A and 904B from which the third silicon oxide film has been removed, thus forming a semiconductor device including an MOS transistor or a polysilicon resistor. Since the silicon oxide film 908 prevents formation of a cobalt silicide, a polysilicon resistor is formed at the left-hand side of FIG. 14B. Thereafter, contacts (not shown) are formed on the cobalt silicide film 909 at both ends of the polysilicon resistor. At the right-hand side of FIG. 14B, the patterned n-type semiconductor region 904B serves as a cobalt silicide gate electrode.

In the foregoing description, the patterned n-type semiconductor region 904B serves as a cobalt silicide gate electrode, and no cobalt silicide is formed in part of the patterned p-type semiconductor region 904A which serves as a polysilicon resistor. Alternatively, the patterned p-type semiconductor region 904A may serve as a cobalt silicide gate electrode and the patterned n-type semiconductor region 904B may have a region in which no cobalt silicide is formed and which serves as a polysilicon resistor.

Embodiment 10

Hereinafter, a semiconductor device and a method for fabricating the semiconductor device according to a tenth embodiment of the present invention will be described with reference to FIGS. 15A and 15B.

Figure 15A:
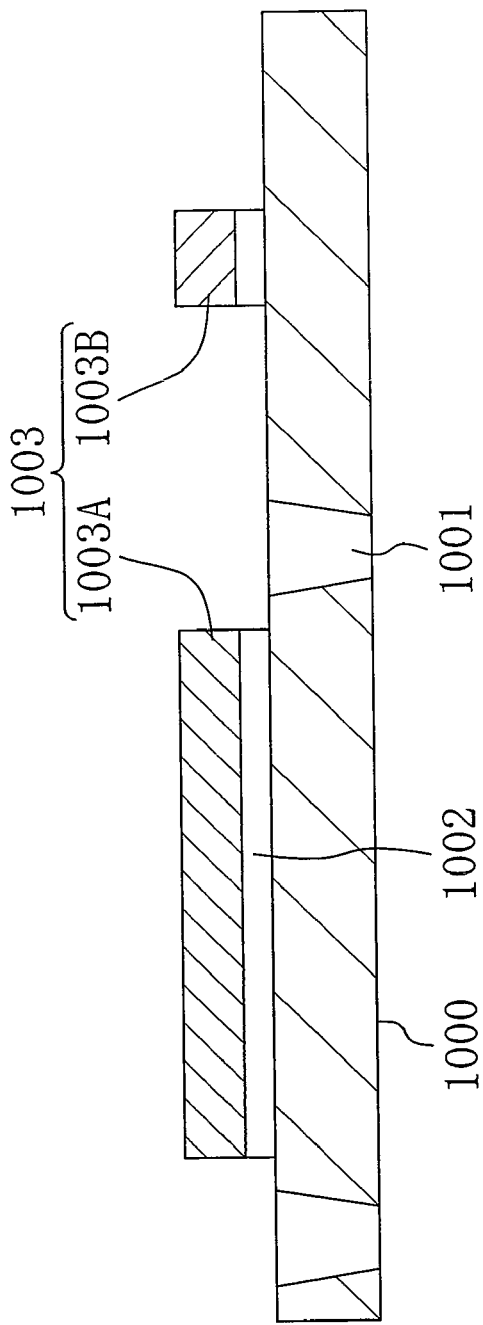
FIGS. 15A and 15B are cross-sectional views for describing a semiconductor device and a method for fabricating the device according to a tenth embodiment of the present invention.
Figure 15B:
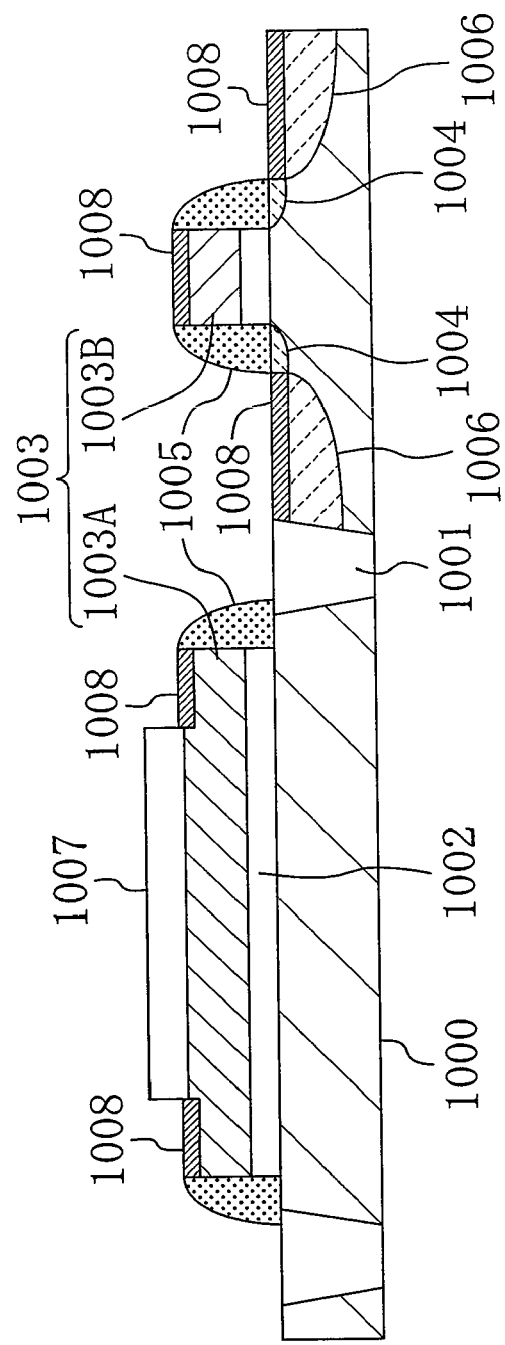
Figure 17A:
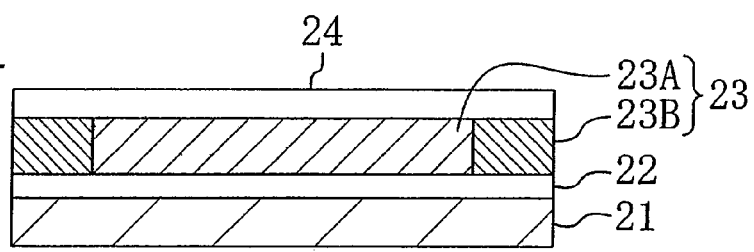
FIGS. 17A and 17B are cross-sectional views for describing the conventional semiconductor device and the method for fabricating the device.
Figure 17B:
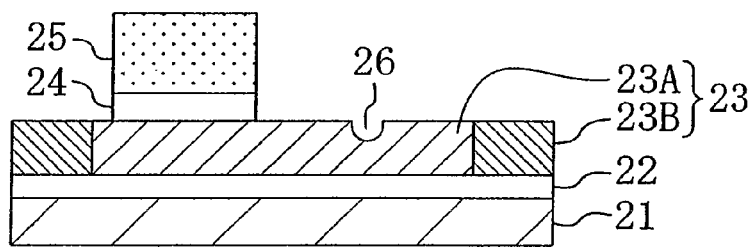
Figure 17C:
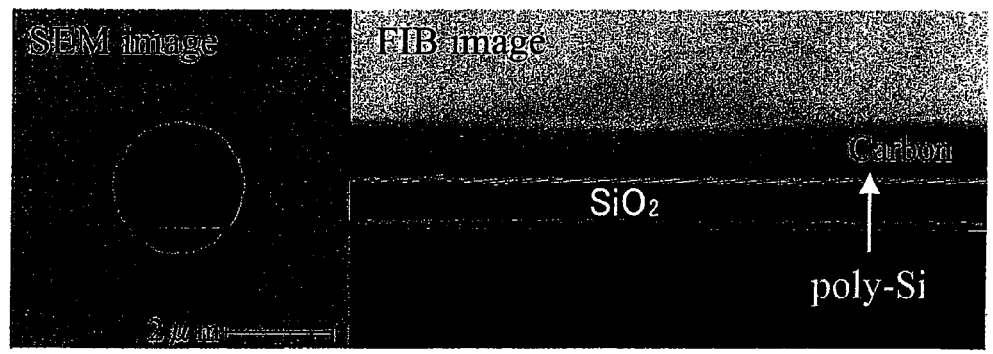
FIG. 17C is photographs showing an SEM image and an FIB image.

FIGS. 15A and 15B are cross-sectional views for describing the semiconductor device and the method for fabricating the device of the tenth embodiment.

As shown in FIG. 15A, isolations 1001 are formed in a silicon substrate 1000. Subsequently, a first silicon oxide film 1002 is formed on the silicon substrate 1000, and then a polysilicon film 1003 is deposited over the first silicon oxide film 1002. Thereafter, boron (B) ions are implanted using a resist pattern as a mask, thereby defining a p-type semiconductor region 1003A in the polysilicon film 1003. Subsequently, phosphorus (P) ions are implanted using a resist pattern as a mask, thereby defining an n-type semiconductor region 1003B in the polysilicon film 1003. Thereafter, patterning is performed to form patterned p-type and n-type semiconductor regions 1003A and 1003B.

Then, as shown in FIG. 15B, the silicon substrate 1000 is doped with an impurity using the patterned p-type and n-type semiconductor regions 1003A and 1003B as a mask, thereby forming a lightly doped layer 1004. Subsequently, a silicon nitride film is deposited over the entire surface of the silicon substrate 1000, and then is subjected to anisotropic etching, thereby forming sidewalls 1005 on the sides of the patterned p-type and n-type semiconductor regions 1003A and 1003B. Thereafter, the silicon substrate 1000 is doped with an impurity using the patterned p-type and n-type semiconductor regions 1003A and 1003B and the sidewalls 1005 as a mask, thereby forming a heavily doped layer 1006.

Then, heat treatment is performed on the silicon substrate 1000 to activate the lightly doped layer 1004 and the heavily doped layer 1006. With respect to the patterned p-type and n-type semiconductor regions 1003A and 1003B, implantation of, for example, boron ions may be performed before the patterning. That is to say, the implantation is not necessarily performed before patterning, and the implantation of the high-concentration impurity may also serve as the implantation for the patterned p-type or n-type semiconductor region 1003A or 1003B instead. Thereafter, a second silicon oxide film is formed over the p-type and n-type semiconductor regions 1003A and 1003B.

At this time, the patterned p-type and n-type semiconductor regions 1003A and 1003B are surrounded with the insulating films, which are oxide films, on all sides vertically and horizontally. In this case, no heat treatment is performed on the second silicon oxide film so that the second silicon oxide film has a high leakage current density, while being an insulating film. Accordingly, the second silicon oxide film serves as a leakage path for charge in the patterned p-type semiconductor region 1003A so that charge in the patterned p-type semiconductor regions 1003A is emitted to the outside of the second silicon oxide film through the second silicon oxide film. Although not shown, there may be a region in which the patterned p-type and n-type semiconductor regions 1003A and 1003B are continuous.

Then, etching is performed with a hydrofluoric acid using a resist pattern as a mask, thereby partly removing the second silicon oxide film except for a portion where a resistor is to be formed, thereby forming a silicon oxide film 1007. At this time, the second silicon oxide film serves as a leakage path so that charge in the patterned p-type semiconductor region 1003A is emitted to the outside through the second silicon oxide film. As a result, it is possible to prevent polysilicon from disappearing during etching.

Subsequently, a cobalt silicide film 1008 is formed in the heavily doped layer 1006 and the patterned p-type and n-type semiconductor regions 1003A and 1003B from which the second silicon oxide film has been removed, thus forming a semiconductor device including an MOS transistor or a polysilicon resistor. Since the silicon oxide film 1007 prevents formation of a cobalt silicide, a polysilicon resistor is formed at the left-hand side of FIG. 15B. Thereafter, contacts (not shown) are formed on the cobalt silicide film 1008 at both ends of the polysilicon resistor. At the right-hand side of FIG. 15B, the patterned n-type semiconductor region 1003B serves as a cobalt silicide gate electrode.

In the foregoing description, the patterned n-type semiconductor region 1003B serves as a cobalt silicide gate electrode, and no cobalt silicide is formed in part of the patterned p-type semiconductor region 1003A which serves as a polysilicon resistor. Alternatively, the patterned p-type semiconductor region 1003A may serve as a cobalt silicide gate electrode and the patterned n-type semiconductor region 1003B may have a region in which no cobalt silicide is formed and which serves as a polysilicon resistor.

It is sufficient for the second silicon oxide film of the first, third, fifth, seventh and ninth embodiments to have a high leakage current density, and the thickness thereof is not necessarily small. Accordingly, the second silicon oxide film may be a film with a different property or a film of a different type, or may be made of a plurality of films having two or more different leakage current densities.

It is sufficient that the silicon oxide film deposited on polysilicon described in the first, third, fifth, seventh and ninth embodiments is an insulating film. Accordingly, for example, the silicon oxide film may be an undoped silicon oxide film formed under sub atmospheric conditions (SA-NSG film), a silicon nitride film, or a silicon oxide film made of a TEOS film or the like formed under a reduced pressure.

The silicon oxide film serving as a leakage path for charge described in the second, fourth, sixth, eighth and tenth embodiments is typified by an undoped silicon oxide film formed under sub atmospheric conditions (SA-NSG film) having a high leakage current density. However, the silicon oxide film may be a film with a different property or a film of a different type so long as the silicon oxide film is an insulating film having a high leakage current density. For example, the leakage current density also changes depending on whether or not the insulating film is annealed after formation of a CVD insulating film. If the insulating film is not annealed, a high leakage current density is obtained.

As described above, according to the inventive semiconductor devices and the methods for fabricating the devices, a leakage insulating film for emitting charge in a semiconductor region of a conductivity type is provided, so that it is possible to prevent the disappearance of polysilicon occurring when any part of the semiconductor region of the conductivity type is exposed to the outside during wet etching. Accordingly, the fault that the gate opens due to the disappearance of polysilicon is prevented. In addition, a short-circuit fault at the gate due to entering of metal into a portion where polysilicon has disappeared is also prevented. Moreover, reduction in the insulating property of a gate insulating film is prevented, resulting in improving the reliability.

What is claimed is:

1. A semiconductor device, comprising:
an insulating film formed on a substrate;
a first semiconductor region into which an impurity is implanted, and which is formed on the insulating film; and
a second semiconductor region of an undoped type formed on the insulating film so as to surround the first semiconductor region,
wherein the insulating film includes a first portion and a second portion, and the first portion of the insulating film has a thickness larger than that of the second portion of the insulating film,
a polysilicon resistor is formed in the first semiconductor region including the second portion, and
the average density of leakage current from the first semiconductor region of a first conductivity type to the outside of the first and second portions of the insulating film has an absolute value of $1 \times 10^{-10}$ (A/mm$^2$) or more when the potential difference between the first semiconductor region of the first conductivity type and the outside of the first and second portions of the insulating film has an absolute value of 1.5 V.

2. The semiconductor device of claim 1, wherein
the second portion of the insulating film is a silicon oxide film, a silicon nitride film, an undoped silicon oxide film, a TEOS film, or a thermal oxidation film.

3. The semiconductor device of claim 1, wherein
a film material of the second portion of the insulating film is different from a film material of the first portion of the insulating film.

4. The semiconductor device of claim 1, wherein
the first semiconductor region is a silicon film into which a p-type impurity or an n-type impurity is implanted.

5. The semiconductor device of claim 1, wherein
the second portion of the insulating film has a leakage current density higher than that of the first portion of the insulating film.

6. A semiconductor device, comprising:
an insulating film formed on a substrate;
a first semiconductor region into which an impurity is implanted, and which is formed on the insulating film; and
a second semiconductor region of an undoped type formed on the insulating film so as to surround the first semiconductor region,
wherein the insulating film includes a first portion and a second portion, the first portion of the insulating film is larger than the second portion of the insulating film, and the first portion of the insulating film has a thickness larger than that of the second portion of the insulating film,
a polysilicon resistor and a gate electrode are formed in the first semiconductor region,
the second portion of the insulating film is formed between the polysilicon resistor and the gate electrode, and
the average density of leakage current from the first semiconductor region of a first conductivity type to the outside of the first and second portions of the insulating film has an absolute value of $1 \times 10^{-10}$ (A/mm$^2$) or more when the potential difference between the first semiconductor region of the first conductivity type and the outside of the first and second portions of the insulating film has an absolute value of 1.5 V.

7. The semiconductor device of claim 6, wherein
the second portion of the insulating film is a silicon oxide film, a silicon nitride film, an undoped silicon oxide film, a TEOS film, or a thermal oxidation film.

8. The semiconductor device of claim 6, wherein
a film material of the second portion of the insulating film is different from a film material of the first portion of the insulating film.

9. The semiconductor device of claim 6, wherein
the first semiconductor region is a silicon film into which a p-type impurity or an n-type impurity is implanted.

10. The semiconductor device of claim 6, wherein
the second portion of the insulating film has a leakage current density higher than that of the first portion of the insulating film.

11. A semiconductor device, comprising:
an insulating film formed on a substrate;
a first semiconductor region into which an impurity of a first conductivity type is implanted, and which is formed on the insulating film; and
a second semiconductor region of a second conductivity type formed on the insulating film so as to surround the first semiconductor region,
wherein the insulating film includes a first portion and a second portion, the first portion of the insulating film is larger than the second portion of the insulating film, and the first portion of the insulating film has a thickness larger than that of the second portion of the insulating film,
a polysilicon resistor is formed in the first semiconductor region including the second portion, and
the average density of leakage current from the first semiconductor region of the first conductivity type to the outside of the first and second portions of the insulating film has an absolute value of $1 \times 10^{-10}$ (A/mm$^2$) or more when the potential difference between the first semiconductor region of the first conductivity type and the outside of the first and second portions of the insulating film has an absolute value of 1.5 V.

12. The semiconductor device of claim 11, wherein
the second portion of the insulating film is a silicon oxide film, a silicon nitride film, an undoped silicon oxide film, a TEOS film, or a thermal oxidation film.

13. The semiconductor device of claim 11, wherein
a film material of the second portion of the insulating film is different from a film material of the first portion of the insulating film.

14. The semiconductor device of claim 11, wherein
the second portion of the insulating film has a leakage current density higher than that of the first portion of the insulating film.

15. The semiconductor device of claim 11, wherein
the first semiconductor region is a silicon film into which a p-type impurity is implanted, and the second semiconductor region is a silicon film into which an n-type impurity is implanted.

16. The semiconductor device of claim 11, wherein
the first semiconductor region is a silicon film into which an n-type impurity is implanted, and the second semiconductor region is a silicon film into which a p-type impurity is implanted.

17. A semiconductor device, comprising:

an insulating film formed on a substrate;

a first semiconductor region into which an impurity of a first conductivity type is implanted, and which is formed on the insulating film; and a second semiconductor region of a second conductivity type formed on the insulating film so as to surround the first semiconductor region, wherein the insulating film includes a first portion and a second portion, the first portion of the insulating film is larger than the second portion of the insulating film, and the first portion of the insulating film has a thickness larger than that of the second portion of the insulating film, a polysilicon resistor and a gate electrode are formed in the first semiconductor region including the second portion, the second portion of the insulating film is formed between the polysilicon resistor and the gate electrode, and the average density of leakage current from the first semiconductor region of the first conductivity type to the outside of the first and second portions of the insulating film has an absolute value of $1 \times 10^{-10}$ (A/mm$^2$) or more when the potential difference between the first semiconductor region of the first conductivity type and the outside of the first and second portions of the insulating film has an absolute value of 1.5 V.

18. The semiconductor device of claim 17, wherein
the second portion of the insulating film is a silicon oxide film, a silicon nitride film, an undoped silicon oxide film, a TEOS film, or a thermal oxidation film.

19. The semiconductor device of claim 17, wherein
a film material of the second portion of the insulating film is different from a film material of the first portion of the insulating film.

20. The semiconductor device of claim 17, wherein
the second portion of the insulating film has a leakage current density higher than that of the first portion of the insulating film.

21. The semiconductor device of claim 17, wherein
the first semiconductor region is a silicon film into which a p-type impurity is implanted, and the second semiconductor region is a silicon film into which an n-type impurity is implanted.

22. The semiconductor device of claim 17, wherein
the first semiconductor region is a silicon film into which an n-type impurity is implanted, and the second semiconductor region is a silicon film into which a p-type impurity is implanted.

\* \* \* \* \*